(12) United States Patent
Nishimura et al.

(10) Patent No.: US 8,748,229 B2
(45) Date of Patent: Jun. 10, 2014

(54) MANUFACTURING METHOD INCLUDING DEFORMATION OF SUPPORTING BOARD TO ACCOMMODATE SEMICONDUCTOR DEVICE

(75) Inventors: Takao Nishimura, Kawasaki (JP); Takayuki Norimatsu, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/593,139

(22) Filed: Aug. 23, 2012

(65) Prior Publication Data

US 2012/0322202 A1    Dec. 20, 2012

Related U.S. Application Data

(62) Division of application No. 12/395,233, filed on Feb. 27, 2009, now abandoned.

(30) Foreign Application Priority Data

Jun. 11, 2008    (JP) .................. 2008-153519

(51) Int. Cl.
*H01L 21/00*    (2006.01)

(52) U.S. Cl.
USPC ........... 438/108; 438/109; 438/126; 257/777; 257/778; 257/723; 257/686

(58) Field of Classification Search
USPC ......... 257/777, 778, 723, 782, 783, 687, 878, 257/678, 787, 788, 789, 790, 791, 792, 793, 257/795, 686; 438/107, 108, 109, 110, 121, 438/126, 127, 125, 106, 112, 124
See application file for complete search history.

(56) References Cited

U.S. PATENT DOCUMENTS

| | | | |
|---|---|---|---|
| 5,054,193 A * | 10/1991 | Ohms et al. ............... 29/840 |
| 5,808,878 A | 9/1998 | Saito et al. | |
| 5,990,553 A | 11/1999 | Morita et al. | |
| 6,365,963 B1 | 4/2002 | Shimada | |
| 6,404,070 B1 | 6/2002 | Higashi et al. | |
| 7,002,251 B2 | 2/2006 | Egawa | |
| 7,615,859 B2 | 11/2009 | Kim et al. | |
| 2003/0183944 A1 | 10/2003 | Taniguchi | |

(Continued)

FOREIGN PATENT DOCUMENTS

| JP | 47-31674 B | 8/1972 |
|---|---|---|
| JP | 50-36086 A | 4/1975 |

(Continued)

OTHER PUBLICATIONS

Non-Final US Office Action dated Dec. 16, 2010, issued in corresponding U.S. Appl. No. 12/395,233, (18 pages).

(Continued)

*Primary Examiner* — Thanh Y Tran
(74) *Attorney, Agent, or Firm* — Westerman, Hattori, Daniels & Adrian, LLP

(57) ABSTRACT

A semiconductor device includes a supporting board, a first semiconductor element mounted on a main surface of the supporting board; and an electronic component provided between the supporting board and the first semiconductor element; wherein the supporting board includes a concave part formed in a direction separated from the first semiconductor element; and at least a part of the electronic component is accommodated in the concave part.

11 Claims, 25 Drawing Sheets

(56) References Cited

U.S. PATENT DOCUMENTS

| | | | |
|---|---|---|---|
| 2006/0087022 A1 | 4/2006 | Chao et al. | |
| 2006/0226520 A1* | 10/2006 | Yoshimura et al. | 257/666 |
| 2009/0032927 A1 | 2/2009 | Kim et al. | |

FOREIGN PATENT DOCUMENTS

| | | |
|---|---|---|
| JP | 51-75964 A | 3/1976 |
| JP | 53-037383 | 4/1978 |
| JP | 58-15361 U | 1/1983 |
| JP | 58-092230 A | 6/1983 |
| JP | 59-094441 A | 5/1984 |
| JP | 60-080232 A | 5/1985 |
| JP | 63-10571 U | 1/1988 |
| JP | 2-84347 U | 6/1990 |
| JP | 6-132351 A | 5/1994 |
| JP | 07-221262 A | 8/1995 |
| JP | 08-250653 A | 9/1996 |
| JP | 11-168185 A | 6/1999 |
| JP | 11-177020 A | 7/1999 |
| JP | 11-214611 A | 8/1999 |
| JP | 11-288977 A | 10/1999 |
| JP | 2000-012733 A | 1/2000 |
| JP | 2000-156461 A | 6/2000 |
| JP | 2001-015679 A | 1/2001 |
| JP | 2001-028409 A | 1/2001 |
| JP | 2001-68620 A | 3/2001 |
| JP | 2001-168270 A | 6/2001 |
| JP | 2001-267489 A | 9/2001 |
| JP | 2001-274317 A | 10/2001 |
| JP | 2001-308140 A | 11/2001 |
| JP | 2001-308258 A | 11/2001 |
| JP | 2002-083925 A | 3/2002 |
| JP | 2002-110871 A | 4/2002 |
| JP | 2002-110894 A | 4/2002 |
| JP | 2002-158326 A | 5/2002 |
| JP | 2002-217332 A | 8/2002 |
| JP | 2002-359345 A | 12/2002 |
| JP | 2003-258197 A | 9/2003 |
| JP | 2004-048074 A | 2/2004 |
| JP | 2004-356133 A | 12/2004 |
| JP | 2004-356654 A | 12/2004 |
| JP | 2004-356655 A | 12/2004 |
| JP | 2005-020004 A | 1/2005 |
| JP | 2005-051261 A | 2/2005 |
| JP | 2005-51261 A | 2/2005 |
| JP | 2005-79489 A | 3/2005 |
| JP | 2006-013554 A | 1/2006 |
| JP | 2006-013555 A | 1/2006 |
| JP | 2006-202783 A | 8/2006 |
| JP | 2008-027994 A | 2/2008 |
| KR | 1998-081172 A | 11/1998 |

OTHER PUBLICATIONS

Non-Final US Office Action dated Oct. 5, 2011, issued in corresponding U.S. Appl. No. 12/395,233, (11 pages).

Final US Office Action dated Apr. 19, 2012, issued in corresponding U.S. Appl. No. 12/395,233, (12 pages).

Non-Final US Office Action dated Aug. 6, 2012, issued in corresponding U.S. Appl. No. 12/395,233, (12 pages).

Korean Office Action dated Oct. 25, 2010, issued in corresponding Korean Patent Application No. 10-2009-0020176.

U.S. Office Action dated Dec. 16, 2010, issued in corresponding U.S. Appl. No. 12/395,233.

U.S. Office Action dated Jun. 10, 2011, issued in corresponding U.S. Appl. No. 12/395,233.

U.S. Office Action dated Oct. 5, 2011, issued in corresponding U.S. Appl. No. 12/395,233.

U.S. Office Action dated Apr. 19, 2012, issued in corresponding U.S. Appl. No. 12/395,233.

U.S. Office Action dated Aug. 6, 2012, issued in corresponding U.S. Appl. No. 12/395,233.

Japanese Office Action dated Jan. 8, 2013, issued in corresponding Japanese patent application No. 2008-153519, w/ partial English translation.

Final US Office Action dated Mar. 11, 2013, issued in corresponding U.S. Appl. No. 12/395,233.

Japanese Office Action dated Apr. 8, 2014, issued in corresponding Japanese Patent Application No. 2013-048059, w/ English translation (3 pages).

* cited by examiner

MANUFACTURING METHOD INCLUDING DEFORMATION OF SUPPORTING BOARD TO ACCOMMODATE SEMICONDUCTOR DEVICE

CROSS-REFERENCE TO RELATED APPLICATIONS

This patent application is a divisional of U.S. application Ser. No. 12/395,233, filed Feb. 27, 2009, which is based upon and claims the benefit of priority of Japanese Patent Application No. 2008-153519 filed on Jun. 11, 2008, the entire contents of which are incorporated herein by reference.

FIELD

The embodiments discussed herein are related to semiconductor devices and manufacturing methods of the semiconductor devices.

BACKGROUND

Accompanying high functionality and miniaturization of electronic devices, high functionality, high speed operations, miniaturization and thinness are required of semiconductor devices such as semiconductor integrated circuit devices provided in the electronic devices.

Because of this, a semiconductor device having the following structure has been suggested. In the semiconductor device, a printed wiring board has a base material and a conductive layer is selectively formed on a main surface or inside the base material. The base material is made of insulation resin such as glass epoxy resin. The conductive layer is made of copper (Cu) or the like. A semiconductor integrated circuit element (hereinafter "semiconductor element") is connected to the conductive layer in a flip chip (face down) state by using convex-shaped or projection-shaped outside connection terminals formed on a main surface of the semiconductor element. In addition, outside connection terminals such as spherical-shaped electrode terminals are provided on electrodes formed on another main surface of the printed wiring board.

In addition, a structure where plural electronic components such as semiconductor elements are provided on the wiring board has been suggested.

Furthermore, a so-called COC (Chip On Chip) structure where plural semiconductor elements having different functions are directly connected to each other via outside connection terminals has been suggested.

On the other hand, in order to reduce the thickness of a package where a semiconductor element is received (mounted), a semiconductor device having the following structure has been suggested. An opening is selectively formed in a printed wiring board so as to pierce the printed wiring board. A chip which is flip chip mounted on a board made of silicon (Si) or ceramic is received in the opening part. A cup-shaped cover is provided so as to cover the chip projecting from the opening part. See Japanese Laid Open Patent Application Publication No. 8-250653.

However, in the structure described in Japanese Laid Open Patent Application Publication No. 8-250653, the opening part corresponding to the chip is formed in the printed wiring board so as to pierce the printed wiring board. Because of this, the manufacturing cost of the printed wiring board is increased. In addition, there is a limitation of internal wirings in the printed wiring board so that the degree of design freedom may be degraded.

If the number of the wiring layers is increased in order to improve the design freedom degree of the wirings, the manufacturing cost is increased. In addition, the thickness of the printed wiring board is increased so that the size of the printed wiring board is made large. This causes large sizes of the semiconductor devices and therefore it may not be possible to meet requirements of small size and thinness.

SUMMARY

According to an aspect of the embodiment, a semiconductor device includes a supporting board; a first semiconductor element mounted on a main surface of the supporting board; and an electronic component provided between the supporting board and the first semiconductor element; wherein the supporting board has a concave part formed in a direction separated from the first semiconductor element; and at least a part of of the electronic component is accommodated in the concave part.

The object and advantages of the invention may be realized and attained by means of the elements and combinations particularly pointed out in the appended claims.

It is to be understood that both the foregoing general description and the following detailed description are exemplary and explanatory and are not restrictive of the invention as claimed.

DESCRIPTION OF EMBODIMENTS

Figure 1:
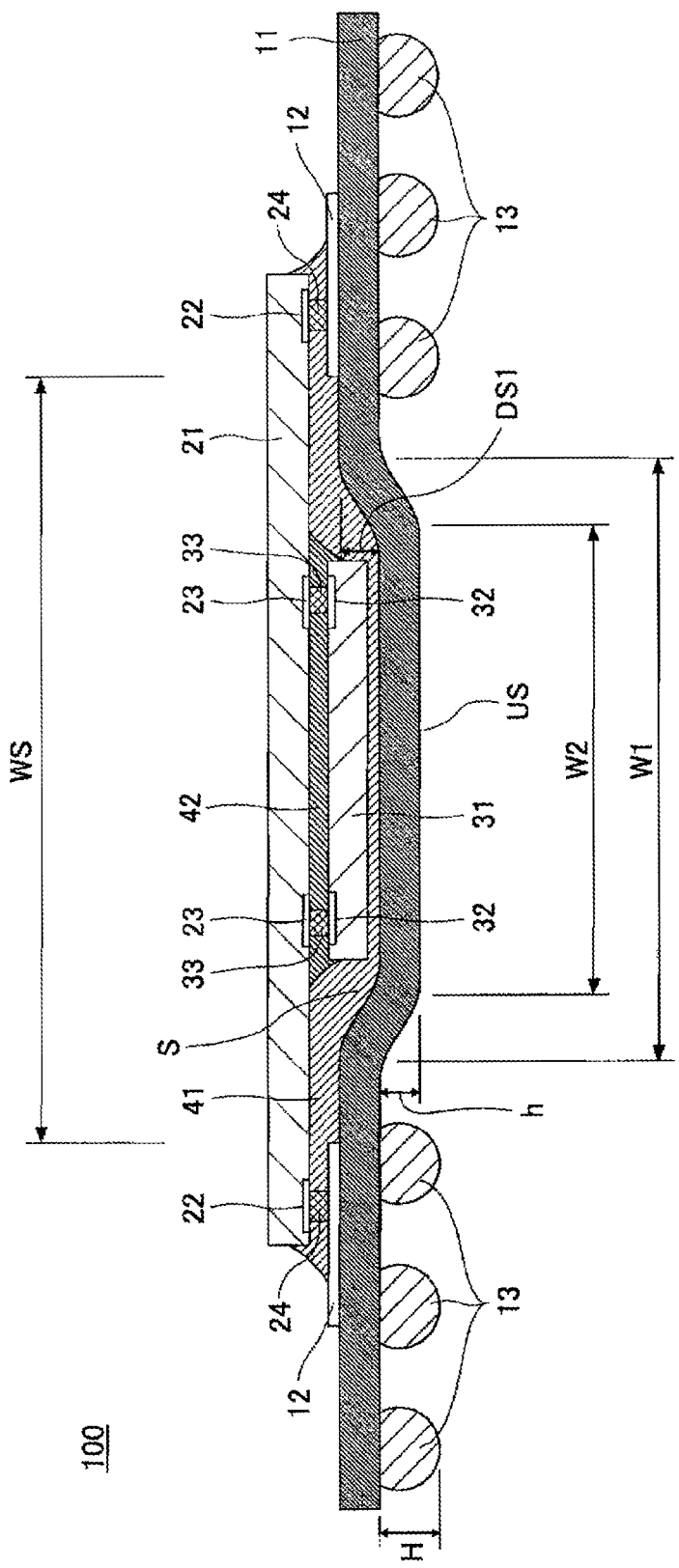
FIG. 1 is a cross section of a semiconductor device of a first embodiment.

First, structures of the semiconductor devices of the embodiments are discussed, and then manufacturing methods of the semiconductor devices are discussed.

Semiconductor Device

First Embodiment

A structure of a semiconductor device 100 of the first embodiment is discussed with reference to FIG. 1.

In the semiconductor device 100, a first semiconductor integrated circuit element (hereinafter "first semiconductor element") 21 is mounted on a main surface (upper surface) of a supporting board 11 by a so-called flip chip (face-down) method.

In the supporting board 11, an area facing one of main surfaces, namely an electronic circuit forming surface, of the first semiconductor element 21 is selectively provided in a direction separated from the first semiconductor element 21. In addition, a concave part S is provided so that a space between the first semiconductor element 21 and the supporting board 11 expands in a vertical direction, namely a direction perpendicular to the main surface of the first semiconductor element 21. The concave part S is situated in a substantially center part of the supporting board 11.

A second semiconductor integrated circuit element (second semiconductor element) 31 is received in the concave part S. The second semiconductor element 31 is mounted on and fixed to the first semiconductor element 21 in a flip chip manner.

The supporting board 11 is called a wiring board, an interposer, or a circuit board. A basic material of the supporting board is, for example, an organic insulation resin such as glass epoxy resin, glass-BT (bismaleimide-triazine) or polyimide. A wiring layer made of copper (Cu) or the like is formed on a surface of or inside the base material with a surface wiring structure or multi-layer structure.

The supporting board 11 may be a flexible (FPC: Flexible Printed Circuit) board having flexibility in a normal temperature range or a so-called rigid board, as long as the supporting board 11 expands by heating and has flexibility. For example, a glass epoxy board having thickness of approximately 0.3 mm and a four layer wiring structure may be used as the supporting board 11.

As discussed above, the concave part S is provided substantially in the center part of the supporting board 11. The thickness of the concave part S is substantially the same as that of other portions of the supporting board 11. The concave part S is configured to project in a direction opposite to the main surface where the first semiconductor element 21 is mounted. The concave part S has a substantially rectangular shaped plan configuration (not illustrated in FIG. 1).

The concave part S is formed by deformation (bending) of the supporting board 11 itself. The concave part S receives a functional element such as a semiconductor element or a passive element.

A conductive layer (not illustrated in FIG. 1) connected to the wiring layer is selectively provided on the main surface of the supporting board 11 where the first semiconductor element 21 is mounted. The conductive layer, except a portion and its periphery where an outside connection terminal of the first semiconductor element 21 is connected, is selectively covered with a solder resist layer (insulation resin film). Parts of the conductive layer, as electrode terminals 12, are exposed on opening parts formed in the solder resist layer.

The concave part S is provided inside portions where the electrode terminals 12 are arranged so as to correspond to an area surrounded or sandwiched by the electrode terminals 12. An opening width W1 of an upper part of the concave part S is less than a distance WS between the electrode terminals 12 facing each other.

On the other hand, an opening width W2 at a lower part (bottom part) of the concave part S is greater than external dimensions of the second semiconductor element 31 received in the concave part S.

A sum of the depth DS1 of the concave part S, the height of an outside connection terminal 24 of the first semiconductor element 21, and the thickness of the electrode terminal 12 is greater than at least a sum of the thickness of the second semiconductor element 31 received in the concave part S and the height of an outside connection terminal 33 connecting the first semiconductor element 21 and the second semiconductor element 31 between the first semiconductor element 21 and the second semiconductor element 31.

Accordingly, the sum of the thickness of the second semiconductor element 31 received in the concave part S and the height of the outside connection terminal 33 is less than the sum of the depth DS1 of the concave part S, the height of the outside connection terminal 24 of the first semiconductor element 21, and the thickness of the electrode terminal 12.

A double layer plating layer of nickel (Ni) and gold (Au) from a lower layer in that order and a triple layer plating layer of copper (Cu), nickel (Ni) and gold (Au) from a lower layer in that order is formed, if necessary, on the surfaces of the electrode terminals 12 of the supporting board 11 by an electrolytic plating method or an electroless plating method. Instead of the plating layer, a solder covering of, for example, zinc (Sn) or an alloy of zinc (Sn), may be applied.

In addition, plural conductive layers are selectively provided on another main surface (rear surface) of the supporting board 11. Outside connection terminals 13 such as spherical electrode terminals whose main ingredient is solder are provided on the conductive layers (not illustrated in FIG. 1).

The height H of the outside connection terminals 13 is greater than a length h between a position of a rear surface US of a portion the supporting board 11 corresponding to the concave part S and positions of other portions of the rear surface of the supporting board 11 (H>h).

The first semiconductor element 21 and the second semiconductor element 31 have structures where a semiconductor manufacturing process (a so-called wafer process) is applied to a semiconductor substrate made of a semiconductor such as silicon (Si) or a chemical semiconductor such as gallium arsenide (GaAs) so that an electronic circuit part is formed on one of main surfaces of the semiconductor substrate. Illustrations of an active element such as a transistor and/or a passive element such as a capacitive element forming the electronic circuit part, a rewiring layer and/or a multilayer wiring layer connecting these functional elements to each other or connecting the functional element and an electrode terminal, and others are omitted in FIG. 1.

The thickness of the first semiconductor element 21 is, for example, approximately 100 μm through approximately 300 μm. In addition, the thickness of the second semiconductor element 31 is, for example, approximately 25 μm through approximately 200 μm.

Figure 2:
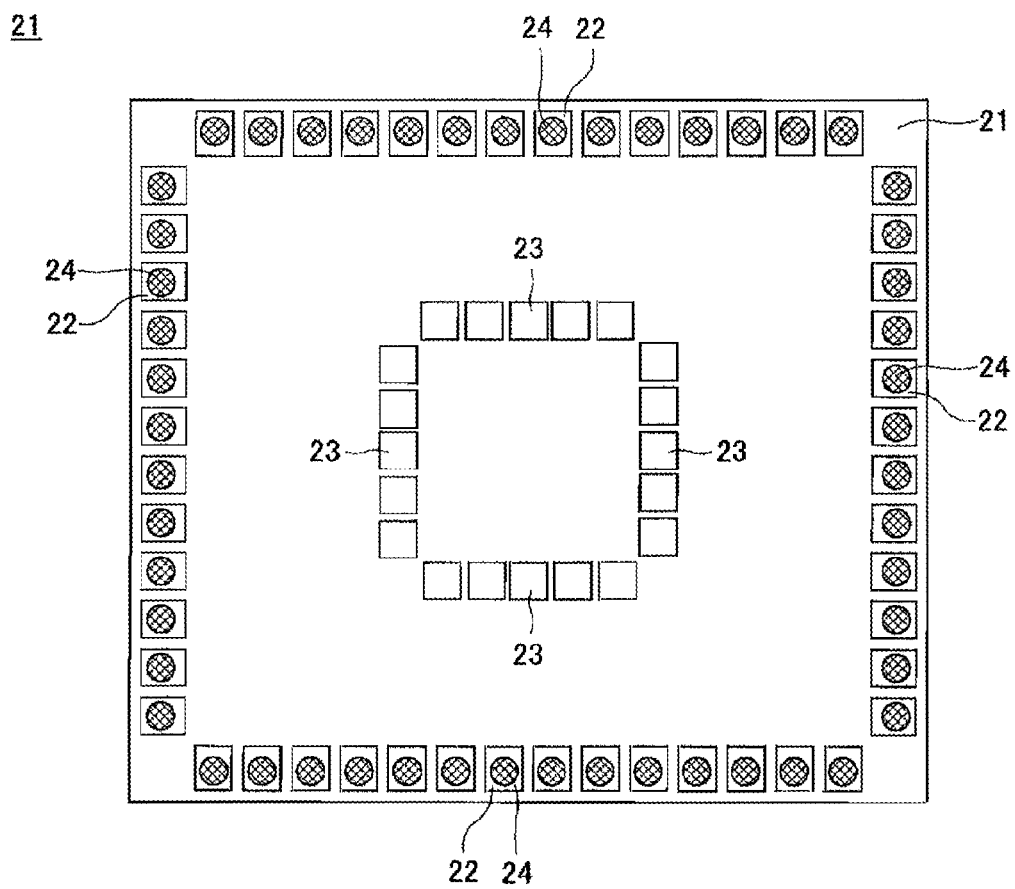
FIG. 2 is a view illustrating a circuit forming surface of a first semiconductor element illustrated in FIG. 1.

An arrangement structure of terminal pads on an electronic circuit forming surface, namely a surface of the first semiconductor element 21 facing the supporting board 11, is illustrated in FIG. 2.

Plural first outside connection terminal pads 22 are provided on the electronic circuit forming surface of the first semiconductor element 21 having the substantially rectangular-shaped configuration in lines along edge parts of four sides of the substantially rectangular-shaped configuration.

In addition, plural second outside connection terminal pads 23 are provided on the substantially center part of the electronic circuit forming surface in a rectangular shaped manner corresponding to the arrangement of the electrode terminals (described below) of the second semiconductor element 31.

In addition, convex shaped outside connection terminals 24 are provided on the first outside connection terminal pads 22 of the first semiconductor element 21. The first outside connection terminal pads 22 and the electrode terminals 12 of the supporting board 11 are mechanically and electrically connected to each other via the outside connection terminals 24.

The first outside connection terminal pads 22 and the second outside connection terminal pads 23 are made of, for example, aluminum (Al), copper (Cu), or an alloy of these metals.

The convex shaped outside connection terminals 24 provided on the first outside connection terminal pads 22 are made of, for example, metal such as gold (Au), copper (Cu), an alloy of these metals, solder of zinc (Sn) and silver (Ag), or solder of zinc (Sn), silver (Ag), and copper (Cu).

In a case where a metal bump made of gold (Au), copper (Cu) or an alloy of these metals is applied to the convex shaped outside connection terminal 24, the outside connection terminal 24 can be formed by, for example, a so-called ball bonding method using a wire bonding technique.

These metal bumps can be formed by an electrolytic plating method. In a case where the metal bumps are formed by the electrolytic plating method, for example, a UBM (Under Bump Metal) layer may be formed on the first outside connection terminal pads 22. The UBM layer is made of, for example, titanium (Ti)/tungsten (W), titanium (Ti)/palladium (Pd), or titanium (Ti)/nickel (Ni)/palladium (Pd).

In a case where solder bumps are applied as the outside connection terminals 24, the outside connection terminals 24 can be formed by, for example, an electrolytic plating method, a transfer printing method, a printing method, or the like. In this case, a UBM (Under Bump Metal) layer may be formed on the first outside connection terminal pads 22. The UBM layer is made of, for example, nickel (Ni), titanium (Ti)/copper (Cu)/nickel (Ni), titanium (Ti)/chrome (Cr)/copper (Cu)/nickel (Ni), or the like.

On the other hand, the outside connection terminals 33 of the second semiconductor element 31 are connected to the second outside connection terminal pads 23.

Plural outside connection terminal pads 32 are provided on the electronic circuit forming surface of the second semiconductor element 31 having the substantially rectangular-shaped configuration along edge parts of four sides of the substantially rectangular-shaped configuration in a line. In addition, the convex shaped outside connection terminals 33 are provided on the outside connection terminal pads 32. In other words, the second outside connection terminal pads 23 of the first semiconductor element 21 and the outside connection terminal pads 32 of the second semiconductor element 31 are electrically connected to each other via the convex shaped outside connection terminals 33.

The outside connection terminal pad 32 of the second semiconductor element 31, as well as the first outside connection terminal pad 22 and the second outside connection terminal pad 23 of the first semiconductor element 21, is made of, for example, aluminum (Al), copper (Cu), or an alloy of these metal.

A convex shaped outside connection terminal 33 provided on the outside connection terminal pad 32, as well as the convex shaped outside connection terminal 24 provided on the first semiconductor element 21 is made of, for example, metal such as gold (Au), copper (Cu), an alloy of these metals, solder of zinc (Sn) and silver (Ag), or solder of zinc (Sn), silver (Ag), and copper (Cu).

In a case where a metal bump made of gold (Au), copper (Cu) or an alloy of these metals is applied to the outside connection terminal 33, the outside connection terminal 33 can be formed by, for example, a so-called ball bonding method or an electrolytic plating method. Furthermore, in a case where a solder bump is applied as the outside connection terminal 33, the outside connection terminal 33 can be formed by, for example, an electrolytic plating method, a transfer printing method, a printing method, or the like.

A double layer plating layer of nickel (Ni) and gold (Au) from a lower layer in that order or solder covering of, for example, zinc (Sn) or an alloy of zinc (Sn) may be applied on a surface of the second outside connection terminal pad 23 of the first semiconductor element 21 where the outside connection terminal 33 of the second semiconductor element 31 is connected.

The convex shaped outside connection terminal 24 of the first semiconductor element 21 may be provided on the electrode terminal 12 of the supporting board 11 which is a terminal of a flip chip mounted side. In addition, the convex shaped outside connection terminal 33 of the second semiconductor element 31 may be provided on the second outside connection terminal pad 23 of the first semiconductor element 21 which is a terminal of a flip chip mounted side.

Figure 3:
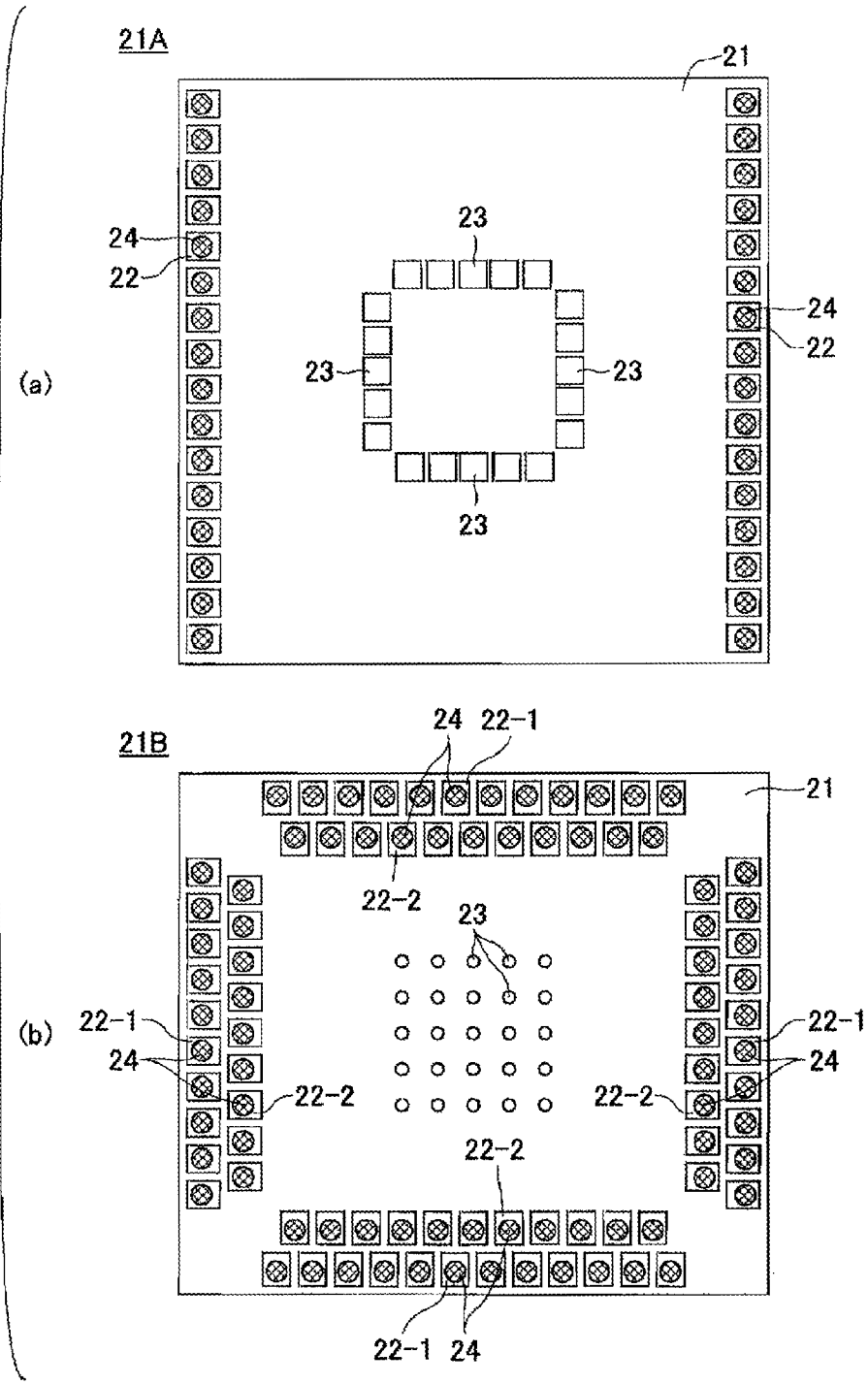
FIG. 3 is a view illustrating a modified example of the circuit forming surface of the first semiconductor element illustrated in FIG. 2.

In the meantime, an example illustrated in FIG. 3(a) or FIG. 3(b) can be applied to an arrangement of the first outside connection terminal pads 22 and the second outside connection terminal pads 23 provided on the main surface (electronic circuit forming surface) of the first semiconductor element 21.

In the example shown in FIG. 3(a), the first outside connection terminal pads 22 are provided in a line manner along two sides facing each other among four sides of the electronic circuit forming surface of the first semiconductor element 21A. On the other hand, the second outside connection terminal pads 23 are arranged in the same manner as that illustrated in FIG. 2.

In the example shown in FIG. 3(b), the first outside connection terminal pads 22 are provided in a plural-lines manner along four sides of the electronic circuit forming surface of the first semiconductor element 21B. According to this structure, since the first outside connection terminal pads 22 are provided in the plural-lines manner, heat may be easily conducted from the first semiconductor element 21 to the supporting board 11 via the first outside connection terminal pads 22.

In the example shown in FIG. 3(b), the second outside connection terminal pads 23 are provided in the substantially center part of the electronic circuit forming surface in a grid manner.

In addition, in the semiconductor device 100, a cured first adhesive 41 is provided between the main surface of the supporting board 11 and the main surface of the first semiconductor element 21 facing this main surface of the supporting board 11. Furthermore, a cured second adhesive 42 is provided between the main surface of the first semiconductor element 21 and the main surface (electronic circuit forming surface) of the second semiconductor element 31 facing this main surface of the first semiconductor element 21.

The first adhesive 41 and the second adhesive 42 are properly selected based on a flip chip method. For example, thermosetting resin whose main ingredient is epoxy group resin can be used as the first adhesive 41 and the second adhesive 42. Conductive fine particles such as silver (Ag), gold (Au), copper (Cu), or nickel (Ni) may be added to the first adhesive 41 and the second adhesive 42.

Thus, in the semiconductor device 100 of the first embodiment, a part of the supporting board 11 where the first semiconductor element 21 is mounted and fixed by a flip chip method, the part facing the first semiconductor element 21, selectively projects in a direction separated from the first semiconductor element 21. As a result of this, a concave part S expanding in a direction perpendicular to the main surface of the first semiconductor element 21 is formed between the first semiconductor element 21 and the supporting board 11.

In addition, the second semiconductor element 31 mounted and fixed on the first semiconductor element 21 is received in the concave part S. In other words, while the semiconductor device 100 has a so-called chip on chip type structure including the first semiconductor element 21 mounted on the supporting board 11 and the second semiconductor element 31 mounted on the first semiconductor element 21, the second semiconductor element 31 is received and arranged in the concave part S between the first semiconductor element 21 and the supporting board 11.

Therefore, in the semiconductor device 100, there is no substantial increase of thickness corresponding to the entire thickness of the second semiconductor element 31. Accordingly, it is possible to realize the semiconductor device having high functions by combining plural semiconductor elements and having a thin and small-sized chip on chip type structure.

The cured first adhesive 41 is provided between the supporting board 11 and the first semiconductor element 21 and between the supporting board 11 and the second semiconductor element 31. On the other hand, the cured second adhesive 42 is provided between the first semiconductor element 21 and the second semiconductor element 31.

A portion where the main surface (electronic circuit forming surface) of the first semiconductor element 21 and the supporting board 11 are connected to each other is protected by the first adhesive 41. In addition, a portion where the main surface of the first semiconductor element 21 and the main surface (electronic circuit forming surface) of the second semiconductor element 31 are connected to each other is protected by the second adhesive 42. Accordingly, while connection between the supporting board 11 and the first semiconductor element 21 is maintained by the first adhesive 41 and connection between the first semiconductor element 21 and the second semiconductor element 31 is maintained by the second adhesive 42, the bending configuration of the supporting board 11 can be fixed and held. Because of this, it is possible to realize a semiconductor device having high reliability.

Second Embodiment

Figure 4:
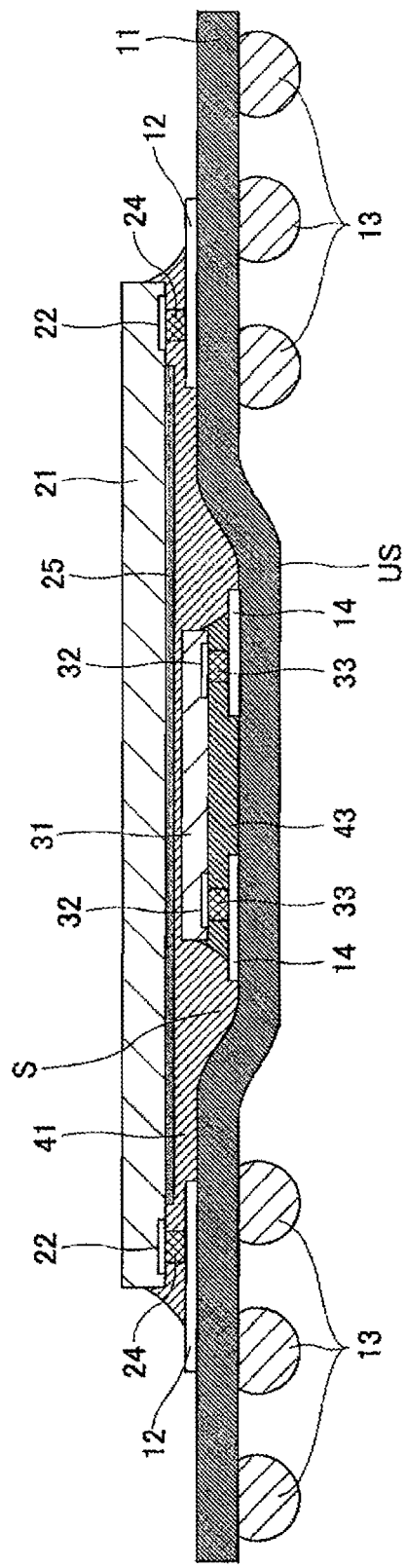
FIG. 4 is a cross section of a semiconductor device of a second embodiment.

A structure of a semiconductor device 200 of the second embodiment is discussed with reference to FIG. 4. In FIG. 4, parts that are the same as the parts shown in FIG. 1 are given the same reference numerals, and explanation thereof is omitted.

In the semiconductor device 200, a first semiconductor element 21 is mounted on a main surface (upper surface) of a supporting board 11 by a so-called flip chip method.

The first semiconductor element 21 of the second embodiment, as well as the first embodiment, has a structure where a semiconductor manufacturing process (a so-called wafer process) is applied to a semiconductor substrate made of a semiconductor such as silicon (Si) or a chemical semiconductor such as gallium arsenide (GaAs) so that an electronic circuit part is formed on one of main surfaces of the semiconductor substrate.

In the supporting board 11, an area facing one of the main surfaces, namely an electronic circuit forming surface, of the first semiconductor element 21 is selectively projected in a direction separated from the first semiconductor element 21. In addition, a concave part S is provided so that a space between the first semiconductor element 21 and the supporting board 11 expands in a vertical direction, namely a direction perpendicular to the main surface of the first semiconductor element 21. The concave part S is situated in a substantially center part of the supporting board 11.

Furthermore, in the semiconductor device 200, the second semiconductor element 31 is mounted and fixed on electrode terminals 14 in the concave part S of the supporting board 11 in a flip chip manner.

In other words, the electrode terminals 14 as a part of the conductive layer of the supporting board 11 are provided in the concave part S on the supporting board 11. The outside connection terminals 33 of the second semiconductor element 31 are connected to the electrode terminals 14.

Figure 5:
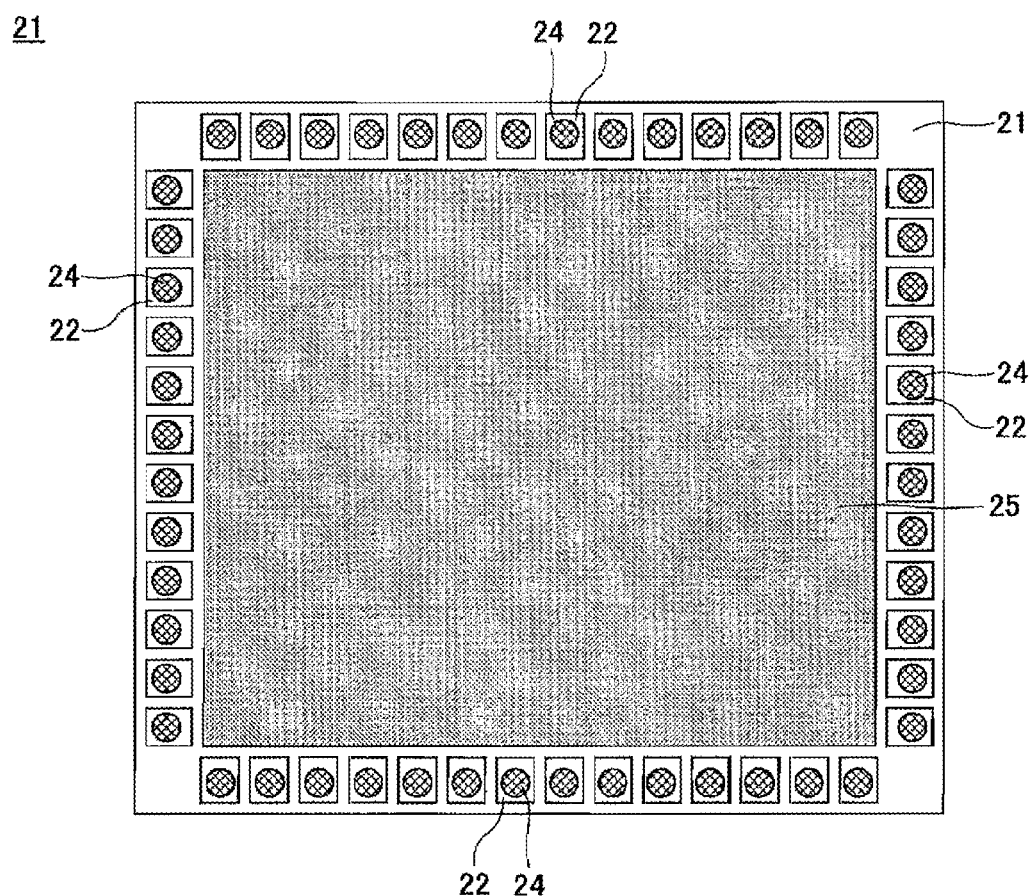
FIG. 5 is a view illustrating a circuit forming surface of a first semiconductor element illustrated in FIG. 4.

The convex shaped outside connection terminals 33 are provided on the outside connection terminal pads 32 formed on the electronic circuit forming surface of the second semiconductor element 31. The outside connection terminal pads 32 and the electrode terminals 14 of the supporting board 11 are electrically and mechanically connected to each other via the convex shaped outside connection terminals 33. Under this structure, an insulation layer 25 is selectively provided at a part facing the second semiconductor element 31 of an electronic circuit forming area of the main surface of the first semiconductor element 21. An arrangement of the insulation layer 25 is illustrated in FIG. 5.

The insulation layer 25 is provided in an area surrounded by the first outside connection terminal pads 22 provided in the vicinities of four sides of the electronic circuit forming surface of the first semiconductor element 21 so as to cover the electronic circuit forming part.

The insulation layer 25 having elasticity is made of a material whose main ingredient is, for example, polyimide group resin, silicon group resin, or epoxy group resin. The insulation layer 25 has thickness of, for example, approximately 1 μm through approximately 15 μm.

By providing the insulation layer 25, it is possible to dielectrically isolate the first semiconductor element 21 from the second semiconductor element 31. Hence, it is possible to prevent operations errors due to contact of the first semiconductor element 21 and the second semiconductor element 31.

Since the insulation layer 25 has elasticity, it is possible to prevent the electronic circuit forming part of the first semiconductor element 21 from being damaged due to a load applied when the first semiconductor element 21 is flip chip mounted on the supporting board 11 during the manufacturing process of the semiconductor device 200. In other words, the insulation layer 25 functions as a stress relief layer configured to prevent damage to the main surface (electronic circuit forming surface) of the first semiconductor element 21 by relieving the stress in the first semiconductor element 21 induced from the second semiconductor element 31 mounted on the supporting board 11 when the first semiconductor element 21 is being flip chip mounted.

Figure 6:
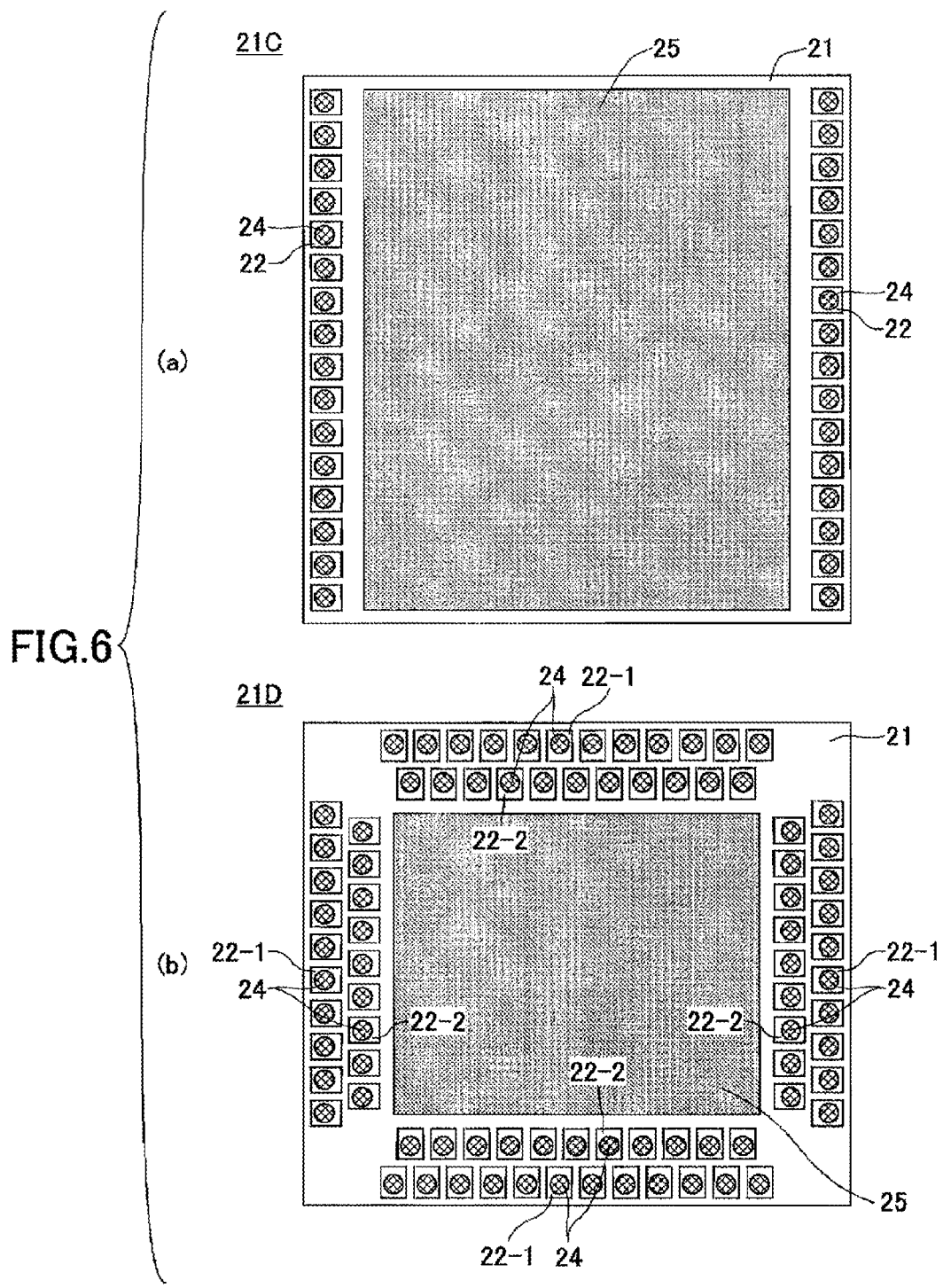
FIG. 6 is a view illustrating a modified example of the circuit forming surface of the first semiconductor element illustrated in FIG. 5.

In the meantime, an example illustrated in FIG. 6(a) or FIG. 6(b) can be applied to an arrangement of the insulation layer 25 and the first outside connection terminal pads 22 on the main surface of the first semiconductor element 21.

In the example illustrated in FIG. 6(a), the first outside connection terminal pads 22 are provided in a line manner along two sides among four sides forming the external circumference of the main surface of the first semiconductor element 21C in the vicinities of the two sides. In addition, the insulation layer 25 is provided between the lines of the first outside connection terminal pads 22 facing each other.

In the example illustrated in FIG. 6(b), plural lines of the first outside connection terminal pads 22-1 and 22-2 are provided along four sides forming the external circumference of the main surface of the first semiconductor element 21D in the vicinities of the four sides. In addition, the insulation layer 25 is provided between the lines of the first outside connection terminal pads 22-2 facing each other.

Although the insulation layer 25 is provided on the main surface (electronic circuit forming surface) of the first semiconductor element 21 in the example illustrated in FIG. 4, the insulation layer 25 may be provided on a second main surface (rear surface, electronic circuit non-forming surface) of the second semiconductor element 31 facing the first semiconductor element 21.

A cured first adhesive 41 is provided between the main surface of the first semiconductor element 21 and the supporting board 11. Furthermore, a cured third adhesive 43 is provided between the main surface of the second semiconductor element 31 and the supporting board 11. The third adhesive 43, as well as the first adhesive 41, is properly selected based on a flip chip method. For example, the third adhesive 43, as well as the first adhesive 41, is selected from the thermosetting resin adhesives. Spherical-shaped electrode terminals as outside connection terminals 13 are provided on a conductive layer (not illustrated in FIG. 6) provided on another main surface (rear surface) of the supporting board 11.

The exposed tops of the outside connection terminals 13 extend lower than the rear surface US of the supporting board 11 formed corresponding to the concave part S.

Thus, in the semiconductor device 200 of the second embodiment, a part facing the first semiconductor element 21 of the supporting board 11 where the first semiconductor element 21 is mounted and fixed by a flip chip method is selectively deformed in a direction separated from the first semiconductor element 21. The concave part S expanding in a direction perpendicular to the main surface of the first semiconductor element 21 is formed between the first semiconductor element 21 and the supporting board 11.

In addition, the second semiconductor element 31 is mounted and fixed on the supporting board 11 by the flip chip method. The first semiconductor element 21 is stacked on the second semiconductor element 31.

In other words, the semiconductor device 200 includes the first semiconductor element 21 and the second semiconductor element 31 mounted on the supporting board 11. The second semiconductor element 31 is received in and provided on the concave part S between the first semiconductor element 21 and the supporting board 11.

Therefore, in the semiconductor device 200, while two semiconductor elements 21 and 31 are stacked on the supporting board 11, there is no substantial increase of thickness corresponding to the entire thickness of the second semiconductor element 31. Accordingly, it is possible to realize the semiconductor device having high functions by combining plural semiconductor elements as a chip on chip type structure that is thin and small-sized.

In addition, the first adhesive 41 is provided between the supporting board 11 and the first semiconductor element 21. On the other hand, the third adhesive 43 is provided between the second semiconductor element 31 and the supporting board 11. In other words, a portion where the main surface (electronic circuit forming surface) of the first semiconductor element 21 and the supporting board 11 are connected to each other is protected by the first adhesive 41. In addition, a portion where the main surface (electronic circuit forming surface) of the second semiconductor element 31 and the supporting board 11 are connected to each other is protected by the third adhesive 43.

Accordingly, while connection between the supporting board 11 and the first semiconductor element 21 is maintained by the first adhesive 41 and connection between the second semiconductor element 31 and the supporting board 11 is maintained by the third adhesive 43, the bending configuration of the supporting board 11 can be fixed and held.

In addition, by providing the insulation layer 25 between the first semiconductor element 21 and the second semiconductor element 31, it is possible to securely isolate the first semiconductor element 21 and the second semiconductor element 31 from each other so that operations errors due to contact between the first semiconductor element 21 and the second semiconductor element 31 are prevented. Because of this, it is possible to realize a semiconductor device having high reliability.

Third Embodiment

A structure of a semiconductor device 300 of the third embodiment is discussed with reference to FIG. 7.

Figure 7:
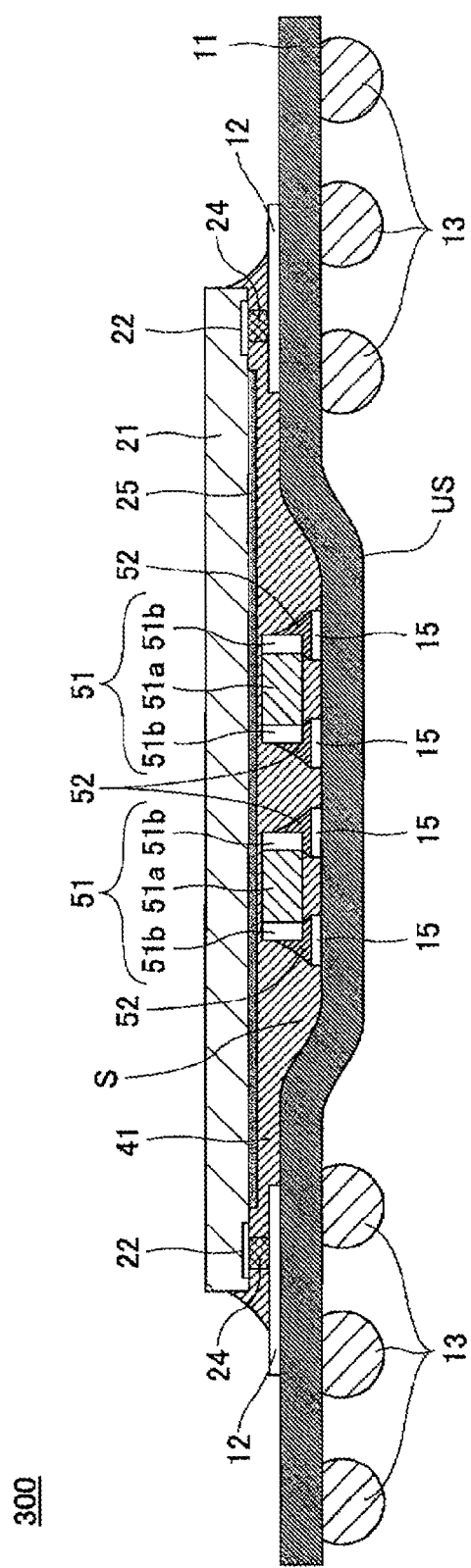
FIG. 7 is a cross section of a semiconductor device of a third embodiment.

In FIG. 7, parts that are the same as the parts shown in FIG. 1 or FIG. 4 are given the same reference numerals, and explanation thereof is omitted.

In the semiconductor device 300, a first semiconductor element 21 is mounted on a main surface (upper surface) of a supporting board 11 by a so-called flip chip method.

In the supporting board 11, an area facing one of main surfaces, namely an electronic circuit forming surface, of the first semiconductor element 21 is selectively projected in a direction separated from the first semiconductor element 21. In addition, a concave part S is provided so that a space between the first semiconductor element 21 and the supporting board 11 expands in a vertical direction, namely a direction perpendicular to the main surface of the first semiconductor element 21. The concave part S is situated in a substantially center part of the supporting board 11.

Furthermore, in the semiconductor device 300, plural passive elements 51 are connected to electrode terminals 15 in the concave part S so as to be mounted on the supporting board 11.

The electrode terminals 15 as a part of the conductive layer of the supporting board are provided on the concave part S of the supporting board 11 so that the electrodes of the passive element 51 are connected to the electrode terminals 15 via conductive adhesive 52.

The passive element 51 is a so-called chip component having a plate-shaped configuration or a pillar-shaped configuration. For example, a capacitance element functioning as a bypass capacitor, an inductor functioning as a noise filter, a resistance element, or the like may be the passive element 51. The passive element 51 includes an insulating element body part 51a and plural electrode terminals 51b provided on edge parts or a single main surface of the insulating element body part 51a. The passive element 51 is properly selected based on circuit structure, size, or the like of the first semiconductor element 21. The position and direction of the electrode terminals 15 are selected so that the passive element 51 is situated as close as possible to electrode terminals of the semiconductor element 21 to be connected.

The electrode terminals 51b of the passive element 51 and the electrode terminals 15 of the supporting board 11 are electrically connected to each other via conductive adhesive 52. As the conductive adhesive 52, for example, a conductive adhesive where conductive particles of silver (Ag), gold (Au), copper (Cu), nickel (Ni), carbon black, or the like are contained in epoxy group resin or silicon group resin, or a solder material such as solder of zinc (Sn) and silver (Ag), or solder of zinc (Sn), silver (Ag), and copper (Cu), may be used.

The spherical shaped electrode terminals as the outside connection terminals 13 are provided on a conductive layer (not illustrated) formed on another surface (rear surface) of the supporting board 11.

The tops of the outside connection terminals 13 extend lower than the rear surface US of the supporting board 11 formed corresponding to the concave part S.

Thus, in the semiconductor device 300 of the third embodiment, a part facing the first semiconductor element 21 of the supporting board 11 where the first semiconductor element 21 is mounted and fixed by a flip chip method is selectively deformed in a direction separated from the first semiconductor element 21. The concave part S expanding in a direction perpendicular to the main surface of the first semiconductor element 21 is formed between the first semiconductor element 21 and the supporting board 11.

In addition, the passive elements 51 are mounted and fixed in the concave part S of the supporting board 11 by the flip chip method. The first semiconductor element 21 is stacked on the passive elements 51. In other words, the semiconductor device 300 includes the first semiconductor element 21 and the passive elements 51 mounted on the supporting board 11. The passive elements 51 are received in and provided on the concave part S between the first semiconductor element 21 and the supporting board 11.

Therefore, in the semiconductor device 300, while the first semiconductor element 21 and the passive elements 51 are stacked on the supporting board 11, there is no substantial increase of thickness corresponding to the entire thickness of the passive element 51. Accordingly, it is possible to realize thin and small-sized semiconductor devices having high stableness of operations by combining the semiconductor element and the passive elements.

In addition, the first adhesive 41 is provided between the supporting board 11 and the first semiconductor element 21. In other words, the passive elements 51 and a portion where the main surface (electronic circuit forming surface) of the first semiconductor element 21 and the supporting board 11 are connected to each other are protected by the first adhesive 41. Accordingly, while connection between the supporting board 11 and the first semiconductor element 21 is maintained by the first adhesive 41 and connection between the passive elements 51 and the supporting board 11 is maintained by the first adhesive 41, the bending configuration of the supporting board 11 can be fixed and held. Because of this, it is possible to realize a semiconductor device having high reliability.

Fourth Embodiment

A structure of a semiconductor device 400 of the fourth embodiment is discussed with reference to FIG. 8.

Figure 8:
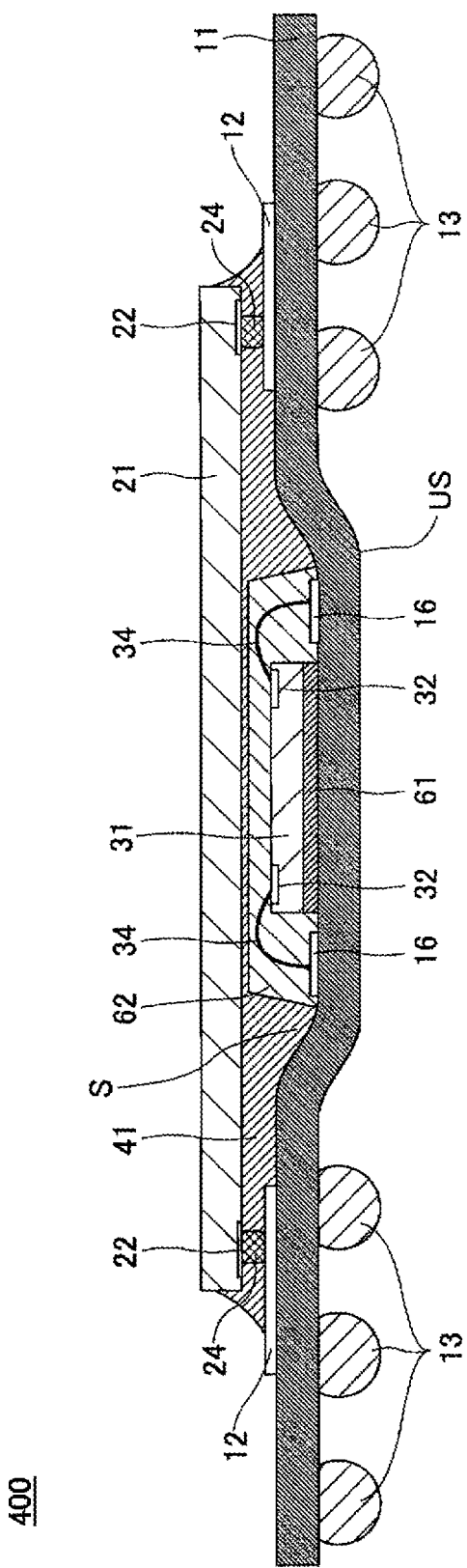
FIG. 8 is a cross section of a semiconductor device of a fourth embodiment.

In FIG. 8, parts that are the same as the parts shown in FIG. 1 or FIG. 4 are given the same reference numerals, and explanation thereof is omitted.

In the semiconductor device 400, a first semiconductor element 21 is mounted on a main surface (upper surface) of a supporting board 11 by a so-called flip chip method.

In the supporting board 11, an area facing one of main surfaces, namely an electronic circuit forming surface, of the first semiconductor element 21 is selectively projected in a direction separated from the first semiconductor element 21. In addition, a concave part S is provided so that a space between the first semiconductor element 21 and the supporting board 11 expands in a vertical direction, namely a direction perpendicular to the main surface of the first semiconductor element 21. The concave part S is situated in a substantially center part of the supporting board 11.

Furthermore, in the semiconductor device 400, the second semiconductor element 31 is mounted and fixed on the concave part S of the supporting board 11 via a die bonding member 61 where the main surface (electronic circuit forming surface) of the second semiconductor element 31 faces upward. The outside connection terminal pads 32 of the second semiconductor element 31 are connected to electrode terminals 16 of the supporting board 11 via bonding wires 34. In addition, the second semiconductor element 31 together with the bonding wires 34 are sealed by sealing resin 62. The die bonding member 61 is made of, for example, a material whose ingredient is polyimide group resin or epoxy group resin. The electrode terminals 16 are made of the same material as that of the electrode terminals 12.

A double layer plating layer of nickel (Ni) and gold (Au) from a lower layer in that order may be formed on a surface of the outside connection terminal pads 32 provided on the main surface of the second semiconductor element 31 by an electroless plating method. In addition, the outside connection terminal pads 32 of the second semiconductor element 31 and the electrode terminals 16 of the supporting board 11 are connected to each other by the bonding wires 34 made of a material whose main ingredient is, for example, gold (Au) or copper (Cu).

The sealing resin 62 is made of a material whose ingredient is, for example, epoxy group resin.

The spherical-shaped electrode terminals as the outside connection terminals 13 are provided on the conductive layer (not illustrated) provided on another main surface (rear surface) of the supporting board 11.

The tops of the outside connection terminals 13 extend lower than the rear surface US of the supporting board 11 formed corresponding to the concave part S.

Thus, in the semiconductor device 400 of the fourth embodiment, a part facing the first semiconductor element 21 of the supporting board 11 where the first semiconductor element 21 is mounted and fixed by a flip chip method is selectively deformed in a direction separated from the first semiconductor element 21. The concave part S expanding in a direction perpendicular to the main surface of the first semiconductor element 21 is formed between the first semiconductor element 21 and the supporting board 11.

In addition, the second semiconductor element 31 is mounted and fixed on the supporting board 11 in a so-called flip chip state. The first semiconductor element 21 is stacked on the second semiconductor element 31. In other words, the semiconductor device 400 includes the first semiconductor element 21 and the second semiconductor element 31 mounted on the supporting board 11. The second semiconductor element 31 is received in and provided on the concave part S between the first semiconductor element 21 and the supporting board 11.

Therefore, in the semiconductor device 400, while two semiconductor elements 21 and 31 are stacked on the supporting board 11, there is no substantial increase of thickness corresponding to the entire thickness of the second semiconductor element 31. Accordingly, it is possible to realize the semiconductor device having high functions by combining plural semiconductor elements as a chip on chip type structure and being thin and small-sized.

In addition, the cured first adhesive 41 is provided between the supporting board 11 and the first semiconductor element 21. Furthermore, the cured first adhesive 41 is also provided between the first semiconductor element 21 and the sealing resin 62 sealing the second semiconductor element 31. In other words, a portion where the main surface (electronic circuit forming surface) of the first semiconductor element 21 and the supporting board 11 are connected to each other is protected by the first adhesive 41.

On the other hand, a portion where the main surface (electronic circuit forming surface) of the second semiconductor element 31 and the supporting board 11 are connected to each other is sealed and protected by the sealing resin 62. Accordingly, connection between the supporting board 11 and the first semiconductor element 21 is maintained by the first adhesive 41, connection between the supporting board 11 and the second semiconductor element 31 is maintained by the sealing resin 62, and the bending configuration of the supporting board 11 can be fixed and held. Because of this, it is possible to realize a semiconductor device having high reliability.

Next, manufacturing methods of the semiconductor devices of the above-discussed embodiments are discussed.

[Manufacturing Method of Semiconductor Device]

(Manufacturing Method of the Semiconductor Device 100)

The manufacturing method of the semiconductor device 100 of the first embodiment is discussed with reference to FIG. 9 through FIG. 14.

In the manufacturing of the semiconductor device 100, first, the second element 31 is flip chip mounted (mounted in a face-down manner) on one of the main surfaces, namely the electronic circuit forming surface, of the first semiconductor element 21.

A thermal compression bonding method via the adhesive, a connecting method using soldering, a thermal compression bonding method, an ultrasonic connecting method, a connecting method using anisotropic conductive resin, or the like can be applied as the flip chip mounting method.

In other words, in this manufacturing method, the second semiconductor device 31 is flip chip mounted on the main surface (electronic circuit forming surface) of the first semiconductor device 21 via the second adhesive 42. As a result of this, the main surface (electronic circuit forming surface) of the second semiconductor device 31 faces the main surface (electronic circuit forming surface) of the first semiconductor device 21. This is discussed with reference to FIG. 9.

In the flip chip mounting method, first, the first semiconductor element 21 is sucked and held on the bonding stage 71 by vacuum suction via absorption holes 72. At this time, the main surface (electronic circuit forming surface) of the first semiconductor device 21 is exposed. See FIG. 9(a).

The convex-shaped outside connection terminals 24 are formed, in advance, on the first outside connection terminal pads 22 on the main surface (electronic circuit forming surface) of the first semiconductor device 21. As the outside connection terminal 24, a metal bump formed by a so-called ball bonding method using a wire bonding technique or an electrolytic plating method or a gold bump formed by the electrolytic plating method, a transferring method, a printing method, or the like can be used.

In the following steps, a double layer plating layer of nickel (Ni) and gold (Au) from a lower layer in that order or solder covering of, for example, zinc (Sn) or an alloy of zinc (Sn) is formed on a surface of the second outside connection terminal pads 23 where the outside connection terminals 33 of the second semiconductor element 31 are connected.

In a surface area of the first semiconductor element 21 surrounded by the second outside connection terminal pads 23, the second adhesive 42 made of a thermosetting material whose main ingredient is epoxy group resin is selectively provided.

On the other hand, the rear surface (electronic circuit non-forming surface) of the second semiconductor element 31 is suctioned and held by a bonding tool (jig) heated at a designated temperature in advance via an absorption hole 82.

As the outside connection terminal 33, a metal bump formed by a so-called ball bonding method using a wire bonding technique or an electrolytic plating method or a gold bump formed by the electrolytic plating method, a transferring method, a printing method, or the like can be used. The sum of thicknesses of the second semiconductor element 31 and the height of the outside connection terminal 33 provided on the outside connection terminal pad 32 of the second semiconductor element 31 is greater than the height of the outside connection terminal 24 formed on the first outside connection terminal pad 22 of the first semiconductor element 21.

The outside connection terminals 33 of the second semiconductor element 31 and the second outside connection terminal pads 23 of the first semiconductor element 21 are made to face each other so as to be positioned.

After that, the bonding tool 81 is lowered so that the outside connection terminals 33 of the second semiconductor element 31 are pushed to the second outside connection terminal pads 23 of the first semiconductor element 21 and thereby the outside connection terminals 33 and the second outside connection terminal pads 23 come in contact with each other. A designated load is applied to the outside connection terminals 33 of the second semiconductor element 31 by the bonding tool 81 so that the outside connection terminals 33 of the second semiconductor element 31 are connected to the second outside connection terminal pads 23 of the first semiconductor element 21.

At this time, the second adhesive 42 flows into the entire area of the lower surface (the electronic circuit forming surface, a surface facing the first semiconductor element 21) of the second semiconductor element 31 so as to reach a space between the first semiconductor element 21 and the second semiconductor element 31 and a side surface external circumferential part of the second semiconductor element 31.

In addition, the second adhesive 42 is thermally cured by heat from the bonding tool 81. See FIG. 9(b).

Thus, the second semiconductor element 31 is flip chip mounted on the first semiconductor element 21.

After that, suction of the bonding tool 81 is turned off so that the bonding tool 81 and the second semiconductor element 31 are separated from each other. Because of this, the bonding tool 81 rises. See FIG. 9(c).

The step of providing the outside connection terminals 24 on the first outside connection terminal pads 22 of the first semiconductor element 21 may be performed after the step of flip chip mounting the second semiconductor element 31.

Next, the first semiconductor element 21 where the second semiconductor element 31 is flip chip mounted is flip chip mounted on the supporting board 11.

Figure 10:
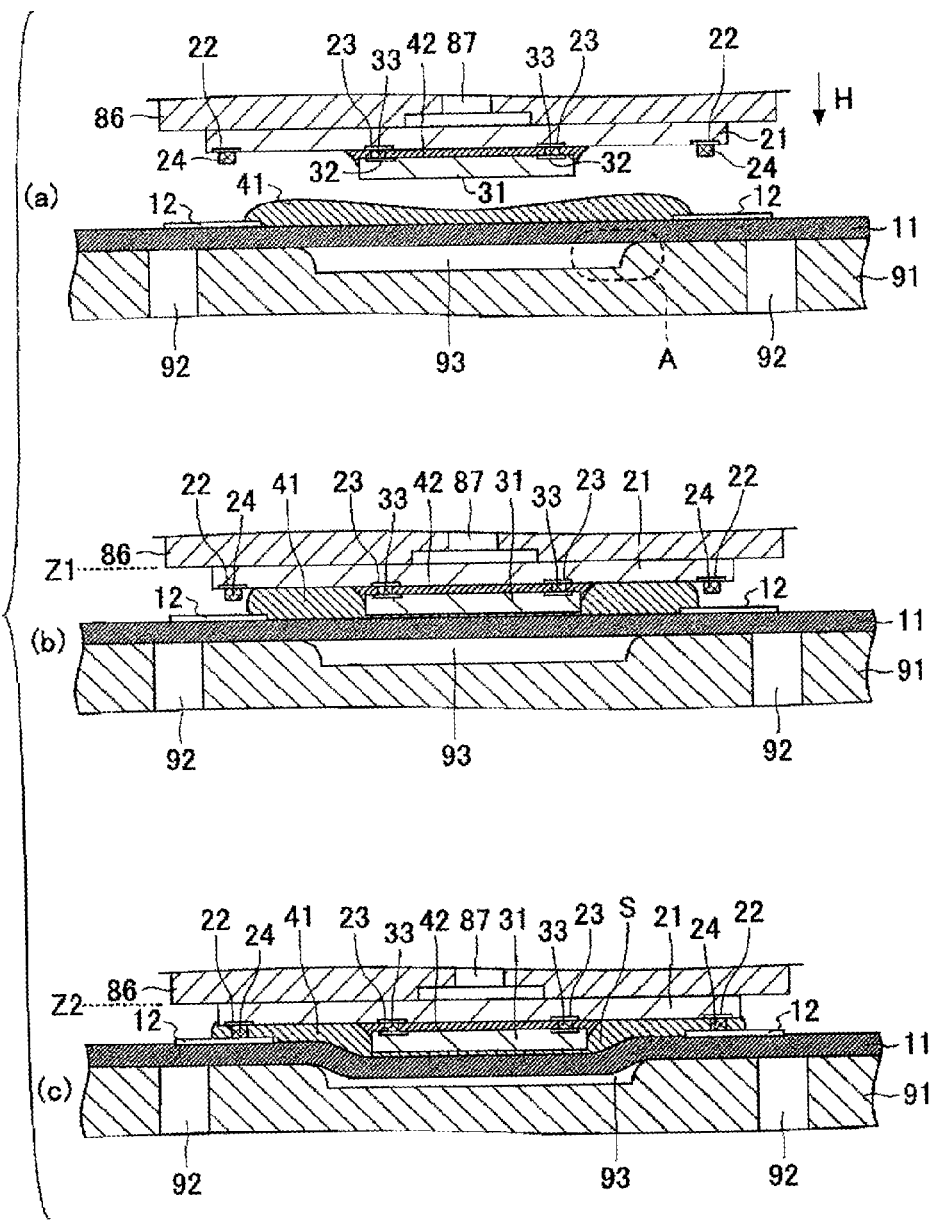
FIG. 10 is a second view illustrating the manufacturing steps of the semiconductor device of the first embodiment.
Figure 11:
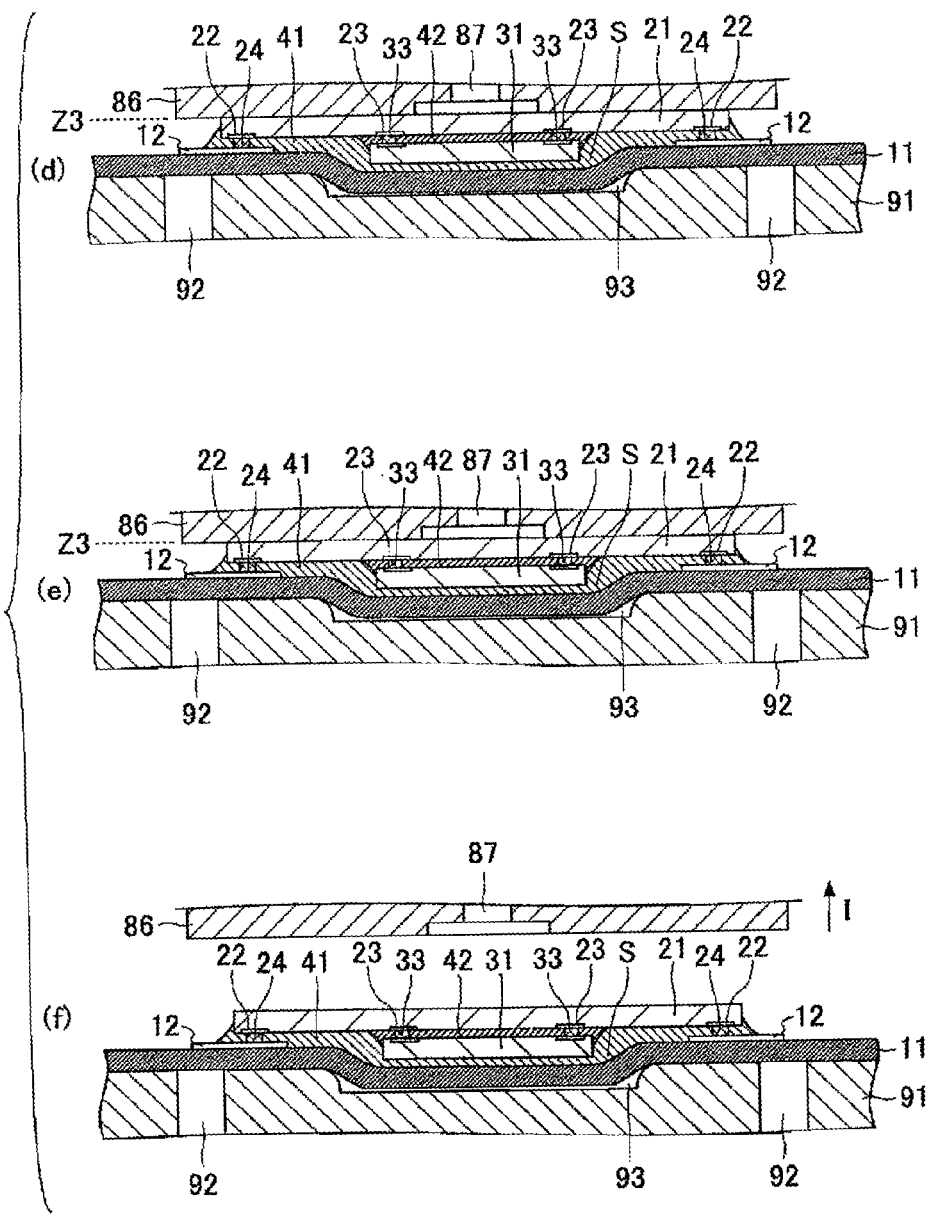
FIG. 11 is a third view illustrating the manufacturing steps of the semiconductor device of the first embodiment.
Figure 12:
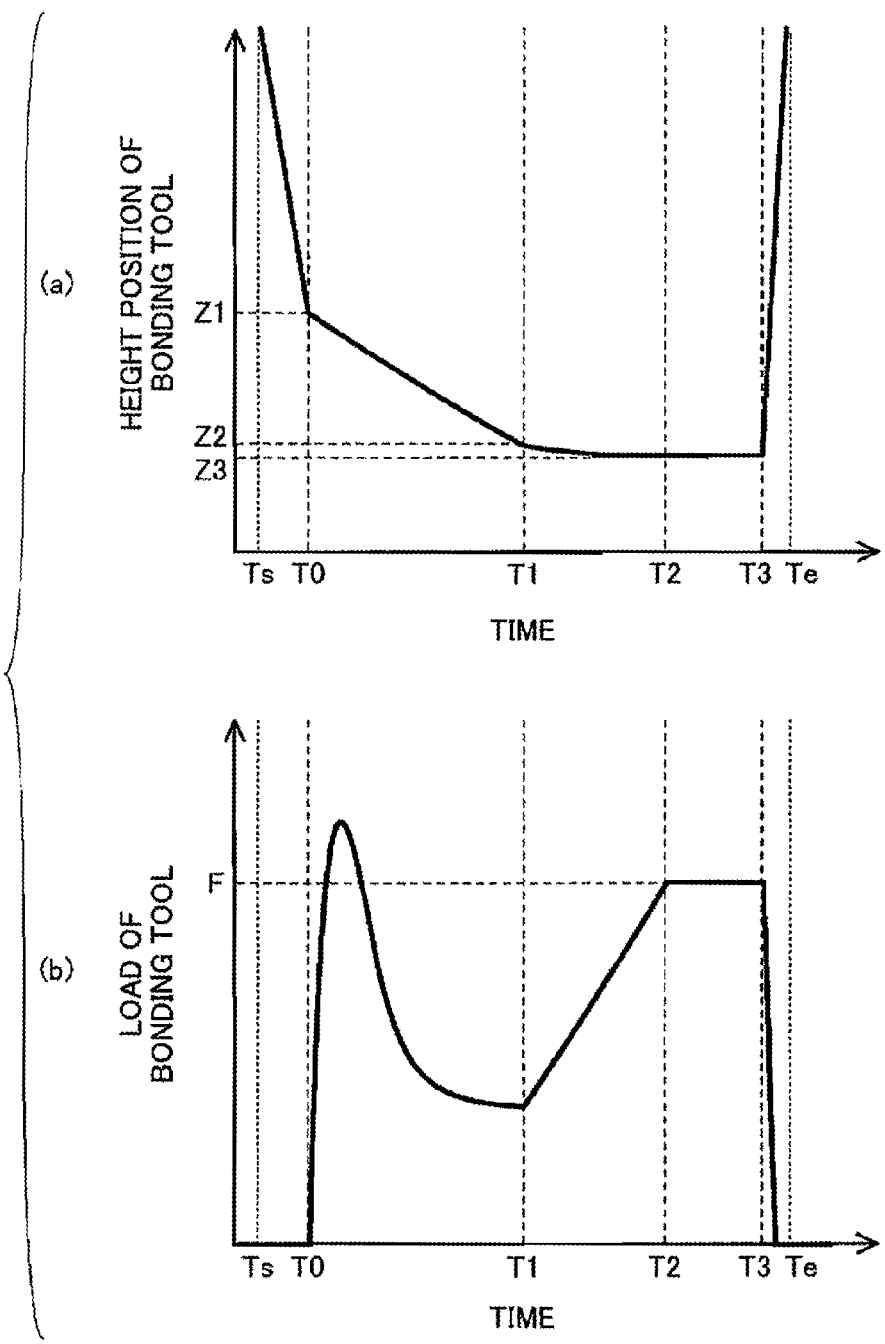
FIG. 12 illustrates graphs illustrating height positions and loads of a bonding tool with time.

A step of mounting the first semiconductor element 21 on the supporting board 11 is discussed with reference to FIG. 10 and FIG. 11.

In this example, a thermal compression bonding method via the first adhesive 41 is used as a method of flip chip mounting the first semiconductor element 21 on the supporting board 11. As the flip chip mounting method, as for heating and pressing by using the bonding tool configured to attract and hold the first semiconductor element 21, a thermal compression bonding method via the adhesive, a connecting method using soldering, a thermal compression bonding method, an ultrasonic connecting method, a connecting method using anisotropic conductive resin, or the like can be used.

First, the supporting board 11 is sucked and held on the bonding stage 91 by vacuum suction via absorption holes 92. See FIG. 10(a).

In the embodiment, the concave part 93 is selectively provided in the bonding stage 91. The concave part 93 has a plane configuration, dimensions, and depth whereby the second semiconductor element 31 with a part of the supporting board 11 is received. Plural electrode terminals 12 as a part of the conductive layer formed on the supporting board 11 are provided on the upper surface of the supporting board 11.

The first adhesive 41 made of epoxy group resin is provided on an area surrounded by plural electrode terminals 12 on the upper surface of the supporting board 11.

The bonding stage 91 is heated at approximately 50° C. through approximately 100° C.

On the other hand, as discussed above, the second main surface (rear surface, electronic circuit non-forming surface) of the first semiconductor element 21 opposite to where the second semiconductor element 31 is flip chip mounted is suctioned and held to the bonding tool 86 via the absorption hole 87. The bonding tool 86 is heated, in advance at a designated temperature (approximately 270° C.) through approximately 300° C.).

The outside connection terminals 24 of the first semiconductor element 21 and the electrode terminals 12 of the supporting board 11 are made to face each other so as to be positioned.

As a result of this, the rear surface (electronic circuit non-forming surface) of the second semiconductor element 31 which is flip chip mounted on the first semiconductor element 21 faces the first adhesive 41 provided on the supporting board 11.

After the above-mentioned positioning is performed, the bonding tool 86 is lowered as illustrated by an arrow H in FIG. 10(a).

Changes of positions of a lower end surface of the bonding tool 86 with time passing is illustrated in FIG. 12(a). In addition, changes of a load detected by a load sensor (not illustrated) connected to the bonding tool 86 with time passing is illustrated in FIG. 12(b).

Time Ts mentioned in FIG. 12(a) and FIG. 12(b) indicates time when the outside connection terminals 24 of the first semiconductor element 21 and the electrode terminals 12 of the supporting board 11 illustrated in FIG. 10(a) are positioned.

By lowering the bonding tool 86, the rear surface (electronic circuit non-forming surface) of the second semiconductor element 31 which is flip chip mounted on the first semiconductor element 21 comes in contact with the supporting board 11. See FIG. 10(b).

Time when contact is generated is indicated as time T0 in FIG. 12(a) and FIG. 12(b). At this time, a sum of thickness of the second semiconductor element 31 and the height of the outside connection terminal 33 provided on the outside connection terminal pad 32 of the second semiconductor element 31 is greater than the height of the outside connection terminal 24 formed on the first outside connection terminal pad 22 of the first semiconductor element 21. Therefore, the outside connection terminals 24 on the first semiconductor element 21 do not come in contact with the electrode terminals 12 on the supporting board 11 and the lower end surface of the bonding tool 86 (a surface facing the supporting board 11) is situated in a position of height Z1.

After that, the pressing force accompanied by lowering of the bonding tool 86 is applied to the supporting board 11 via the first semiconductor element 21, the second semiconductor element 31, and the second adhesive 42.

By this pressing force, a part of the supporting board 11 corresponding to at least the rear surface and its periphery of the second semiconductor element 31 is pressed into the concave part 93 provided on an upper part of the bonding stage 91 so as to extend.

At this time, the bonding tool 86 is, as discussed above, heated at a designated temperature. Heat from the bonding tool 86 is conducted to the second semiconductor element 31 via the first semiconductor element 21 and the outside connection terminals 33, and thereby the supporting board 11 close to the second semiconductor element 31 is locally heated. By this heat, local thermal expansion is generated and progresses at the supporting board 11 so that the supporting board 11 is easily expanded into the concave part 93 of the bonding stage 91 and begins bending.

In other words, as illustrated in FIG. 12(b), a reaction force acting from the supporting board 11 to the bonding tool 86 increases for a while based on application of the pressing force by the bonding tool 86. As time passes, the reaction force is decreased due to deformation (expansion or bending) of the supporting board 11. In FIG. 12(b), the reaction force is indicated as a pressing load corresponding to the reaction force.

Heating the supporting board 11 makes the extension of the supporting board 11 due to pressing of the bonding tool 86 easy. By setting the heating temperature equal to or higher than a glass transition temperature of the supporting board 11, it is possible to easily deform or bend the supporting board 11.

By application of the pressing force or heating, in the concave part 93 of the bonding stage 91, the supporting board 11 extends along the internal surface of the concave part 93 so as to be bent and thereby the concave part S where the second semiconductor element 31 can be received starts being formed.

In addition, the viscosity of the first adhesive 41 adhered on the supporting board 11 is decreased due to heat from the bonding tool 86 conducted by contact of the supporting board 11 and the second semiconductor element 31 so that flowability of the first adhesive 41 is increased. The first adhesive 41 is pushed and extended in the entire area where the first semiconductor element 21 faces the supporting board 11 between the supporting board 11 and the first semiconductor element 21.

In addition, by lowering the bonding tool 86 further, the outside connection terminals 24 of the first semiconductor element 21 are made to come in contact with the electrode terminals 12 on the supporting board 11 (first pressing by position control).

At time T1 (see FIG. 10(c)) when contact is made, a lower end surface of the bonding tool 86 is positioned at the height Z2.

By contacting the outside connection terminals 24 of the first semiconductor element 21 with the electrode terminals 12 of the supporting board 11, the heat of the bonding tool 86 is conducted to the supporting board 11 via the first semiconductor element 21, the second semiconductor element 31, the outside connection terminals 33 and the outside connection terminals 24. Accordingly, the first adhesive 41 further flows and reaches the periphery of the electrode terminals 12.

As discussed above, the load detected by the load sensor is controlled from time T1 when the outside connection terminals 24 of the first semiconductor element 21 and the electrode terminals 12 on the supporting board 11 come in contact with each other to time T3 when the flip chip mounting of the first semiconductor element 21 onto the supporting board 11 is completed. (second pressing by the load control)

The load is controlled so that the load detected by the load sensor reaches the value F at time T2. The value F is set approximately 10 gf through approximately 60 gf per each of the outside connection terminals 24 formed on the first semiconductor element 21. See FIG. 12(b).

By applying the load, the outside connection terminals 24 formed on the first semiconductor element 21 are connected to the electrode terminals 12 on the supporting board 11. At this time, since plastic deformation of the outside connection terminals 24 occurs, the position of the lower end surface of the bonding tool 86 is slightly lowered from the height Z2 so as to reach the height Z3. See FIG. 11(d).

The load having the value F at time T2 is maintained until the designated time T3.

From time T2 to time T3, the supporting board 11 is heated by heat transferred from the bonding tool 86 via the first semiconductor element 21, the second semiconductor element 31, the outside connection terminals 33, and the outside connection terminals 24, so that the heated area is expanded and local heat expansion of the supporting board 11 further progresses.

As a result of this, expansion or bending of the supporting board 11 in the concave part 93 of the bonding stage 91 progresses and the reaction force acting from the supporting board 11 to the first semiconductor element 21 via the second semiconductor element 31 decreases.

Heat curing of the first adhesive 41 progresses, where the first adhesive 41 is pressed and expanded to the entire space between the supporting board 11 and the first semiconductor element 21 so as to reach the periphery of the outside connection terminals 24.

In order to make the application of the load by the bonding tool 86 effective, the absorption holes 92 of the bonding stage 91 are arranged in positions different from being right under the connection position of the electrode terminals 12 of the supporting board 11 and the outside connection terminals 24 of the first semiconductor element 21.

At time T3, mounting of the first semiconductor element 21 on the supporting board 11 is completed (see FIG. 11(e)).

At this time, the space between the supporting board 11 and the rear surface of the second semiconductor element 31 has been expanded. Hence, the reaction force from the supporting board 11 to the first semiconductor element 21 via the second semiconductor element 31 is not generated. The load detected by the load sensor is maintained to have the value F.

In addition, the lower end surface of the bonding tool 86 is maintained in a position of the height Z3.

The first adhesive 41 is cured where the supporting board 11 is bent into the concave part 93 of the bonding stage 91. As a result of this, the first adhesive 41 provides underfill, namely protection of the outside connection terminals 24 and the circuit forming surface of the first semiconductor element 21 and fixing between the first semiconductor element 21 and the supporting board 11. By a connecting force and a shrinkage force on curing of the first adhesive 41, connection between the first semiconductor element 21 and the supporting board 11 via the outside connection terminals 24 is maintained.

When the first semiconductor element 21 is mounted on the supporting board 11, suction of the bonding tool 86 is turned off and the bonding tool 86 rises as indicated by an arrow I in FIG. 11(f). (time Te)

As the pressing by the bonding tool 86 is turned off or the first adhesive 41 is cured and contracts, the supporting board 11 slightly rises upward in the concave part 93 of the bonding stage 91. Hence, it is possible to easily take out the supporting board 11 from the bonding stage 91.

Furthermore, the outside connection terminals 13 are provided on the supporting board 11 taken out from the bonding stage 91.

In other words, plural outside connection terminals 13 such as spherical shaped electrode terminals whose main ingredient is solder are provided on the conductive layer selectively provided on the rear surface of the supporting board 11, and thereby the semiconductor device 100 illustrated in FIG. 1 is formed.

Thus, in the manufacturing method of this embodiment, pressing by the bonding tool 86 to the supporting board 11 is done on the bonding stage 91 having the concave part 93 and supporting board 11 via the first semiconductor element 21 flip chip mounted on the supporting board 11 and the second semiconductor element 31 flip chip mounted on the first semiconductor element 21. As a result of this, the supporting board 11 is locally pressed on the concave part 93.

The supporting board 11 is locally heated by heat conducted from the bonding tool 86 via the first semiconductor element 21 and the second semiconductor element 31.

As a result of this, the supporting board 11 expands and bends in the concave part 93 of the bonding stage 91 in a direction separated from the main surface where the first semiconductor element 21 is mounted. In other words, the concave part S is formed at the supporting board 11 due to local extension or bending of the supporting board 11 generated by local pressing and heat. The second semiconductor element 31 is received in the concave part S in the thickness direction of the second semiconductor element 31.

Accordingly, while two semiconductor elements, namely the first semiconductor element 21 and the second semiconductor element 31, are stacked on the supporting board 11, there is no substantial increase of thickness corresponding to the entire thickness of the second semiconductor element 31.

In other words, in the manufacturing method of this embodiment, it is possible to manufacture the semiconductor device which has plural semiconductor elements, namely the first semiconductor element 21 and the second semiconductor element 31, and for which thinness and small sizes are required, with a simple step. Hence, it is possible to reduce the manufacturing cost.

In addition, the bonding tool 86 is lowered while the height position of the bonding tool 86 is controlled, so that the outside connection terminals 24 formed on the first semiconductor element 21 and the electrode terminals 12 formed on the supporting board 11 come in contact with each other. After that, the load of the bonding tool 86 is controlled so as to provide the load to the outside connection terminals 24. Accordingly, the outside connection terminals 24 can be securely connected to the electrode terminals 12 of the supporting board 11 by the load. Therefore, it is possible to obtain a mounting structure with high connection reliability.

In a case where the adhesive 41 is cured at the time T2, flip chip mounting of the first semiconductor element 21 onto the supporting board 11 is completed. Therefore, suction of the bonding tool 86 may be turned off at this time and the bonding tool 86 may rise.

In addition, after the flip chip mounting of the first semiconductor element 21 onto the supporting board 11 is completed, a post cure process may be implemented so that the second adhesive 42 between the first semiconductor element 21 and the second semiconductor element 31 may be cured.

The semiconductor device 100 illustrated in FIG. 1 is manufactured by using the manufacturing method of this embodiment under conditions described below.

A glass epoxy board having thickness of approximately 0.3 mm and four-layers wiring structure was used as the supporting board 11. A glass transition temperature of this board was approximately 170° C. through approximately 185° C. according to the result of the measurement using TMA method defined by JIS-C-6481 test method for copper-clad laminates for printed wiring boards.

In addition, as the first semiconductor element 21, a silicon semiconductor element having a size of approximately 13 mm×approximately 13 mm and a thickness of approximately 200 μm was used. 840 gold (Au) bumps were formed as the outside connection terminals 24 of the first semiconductor element 21 by using a ball bonding method using gold (Au) wires.

On the other hand, as the second semiconductor element 31, a silicon semiconductor element having a size of approximately 6 mm×approximately 6 mm and a thickness of approximately 100 μm was used. 380 gold (Au) bumps were formed as the outside connection terminals 33 of the second semiconductor element 31 by using a ball bonding method using gold (Au) wires.

In addition, the heating temperature of the bonding tool 86 configured to take suction on and hold the first semiconductor element 21 was set to be approximately 270° C. through approximately 300° C. The heating temperature of the bonding stage 91 configured to take suction on and hold the supporting board 11 was set to be approximately 50° C. through approximately 100° C. In addition, the concave part 93 of the bonding stage 91 was set to have a rectangular-shaped configuration of approximately 8.5 mm×approximately 8.5 mm and a thickness DS2 of approximately 0.2 mm.

Under the above-mentioned conditions, by using the manufacturing method of this embodiment, the first semiconductor element 21 where the second semiconductor element 31 was flip chip mounted was flip chip mounted on the supporting board 11.

A peak temperature of the supporting board at the time of mounting was approximately 200° C. through approximately 300° C. The amount of deformation of the supporting board 11 at the time of mounting was approximately 130 μm.

Figure 13:
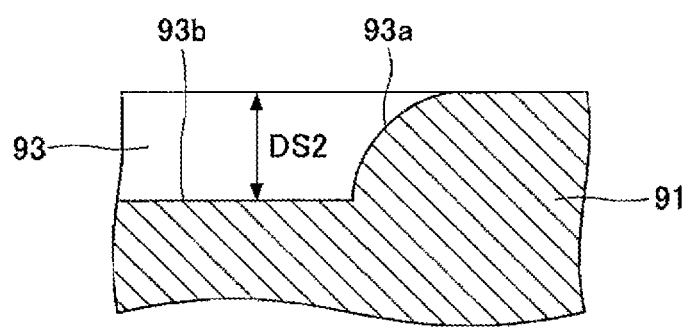
FIG. 13 is an expanded view of a part surrounded by a dotted line A in FIG. 10(*a*)
Figure 14:
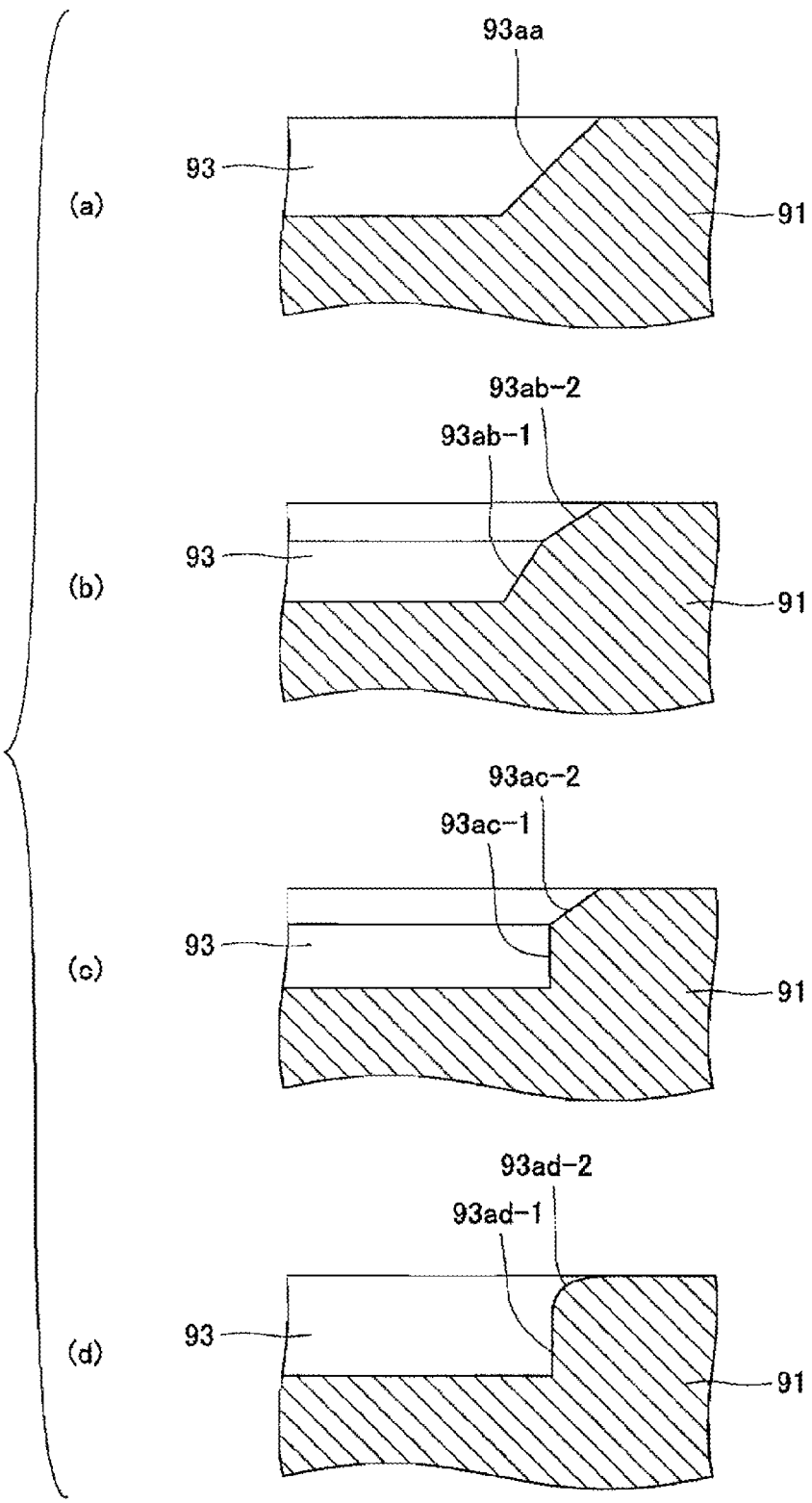
FIG. 14 is a view illustrating modified examples of a concave part formed in the bonding tool.

In the manufacturing method of this embodiment, a cross-sectional configuration of a bottom part and an internal side surface (side wall surface) extending from the bottom part of the concave part 93 of the bonding stage 91 is illustrated in FIG. 13.

A portion surrounded by a dotted line A in FIG. 10(a) is illustrated in FIG. 13. An illustration of the supporting board 11 is omitted in FIG. 13.

In other words, an internal side surface 93a of the concave part 93 extends from a plane concave part bottom surface 93b to an upper surface. The internal side surface 93a has an arc shaped cross section which is a convex shape toward an inside of the concave part 93.

The concave part 93 having the arc-shaped cross section has the internal side surface opening upward. Therefore, when the supporting board 11 extends and is bent so as to come in contact with the internal side surface of the concave part 93, it is possible to prevent or reduce the concentration of the stress to a specific portion of the supporting board 11. Hence, it is possible to prevent future generation of damage to the wiring in the supporting board 11.

The bottom surface 93b of the concave part 93 is flat. The depth DS2 of the concave part 93 is set so that the lower side surface (second main surface) of the supporting board 11 comes in contact with the bottom surface of the concave part 93 when the second semiconductor element 31 is received in the thickness direction of the second semiconductor element 31 and the supporting board 11 extends and is bent. As a result of this, the amount of bending of the supporting board 11 is limited and the lower side surface of the supporting board 11 has a flat surface.

A configuration of the internal side surface of the concave part 93 is not limited to the example illustrated in FIG. 13.

For example, the internal side surface of the concave part 93 may be an inclined surface 93aa extending from the bottom part with an obtuse angle. See FIG. 14(a).

In addition, the inclination angle of the internal side surface may be changed on the way so that internal side surfaces 93ab-1 and 93ab-2 having at least two inclination angles may be formed. See FIG. 14(b).

Furthermore, the internal side surface may have a vertical surface 93ac-1 from the bottom part at the designated height and an inclined surface 93ac-2 with a designated inclination angle. See FIG. 14(c).

Furthermore, the internal side surface may have a vertical surface 93ad-1 from the bottom part at the designated height and an arc shaped internal side surface 93ad-2 extending from the vertical surface 93ad-1. See FIG. 14(c).

In any configuration mentioned above, the concave part 93 has the internal side surface opening upward. Therefore, when the supporting board 11 extends and is bent, even if the supporting board 11 comes in contact with the internal side surface of the concave part 93, it is possible to prevent and reduce the concentration of the stress to a specific portion of the supporting board 11. Hence, damage to the wiring layer formed in the supporting board 11 can be prevented.

In the example discussed with reference to FIG. 10 and FIG. 11, in the concave part 93 of the bonding stage 91, the pressing force is mechanically and locally provided and heat is applied to the supporting board 11 so that extension and bending are generated. However, vacuum (decompression) suction may be taken in the concave part 93 so that the extension and bending of the supporting board 11 can be hastened.

Figure 15:
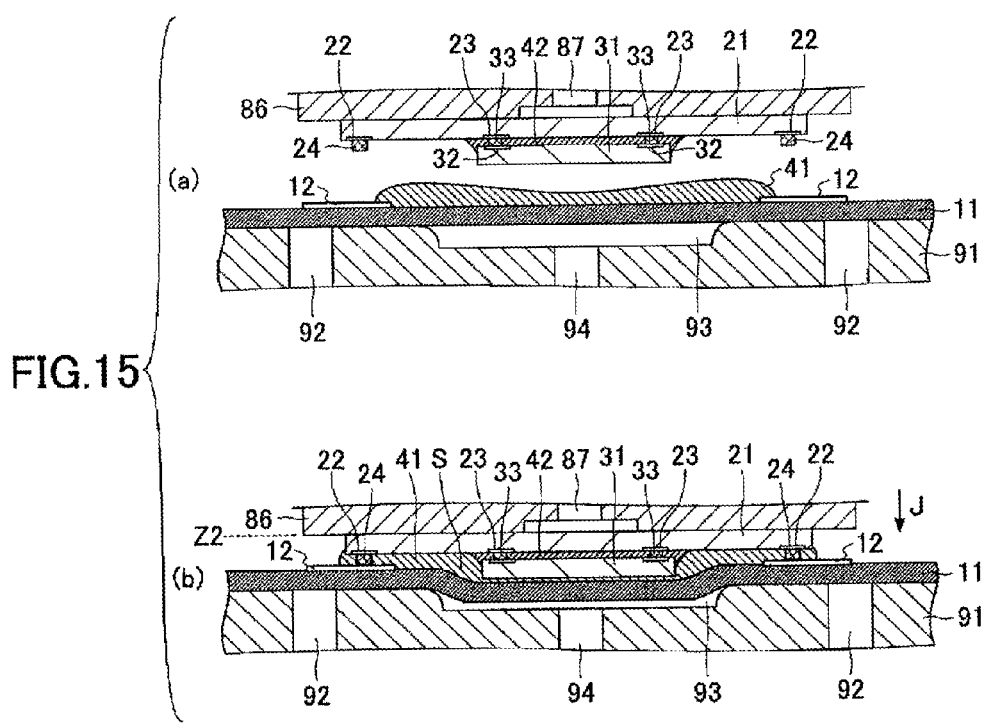
FIG. 15 is a first view illustrating a modified example of steps illustrated in FIG. 10 and FIG. 11.
Figure 16:
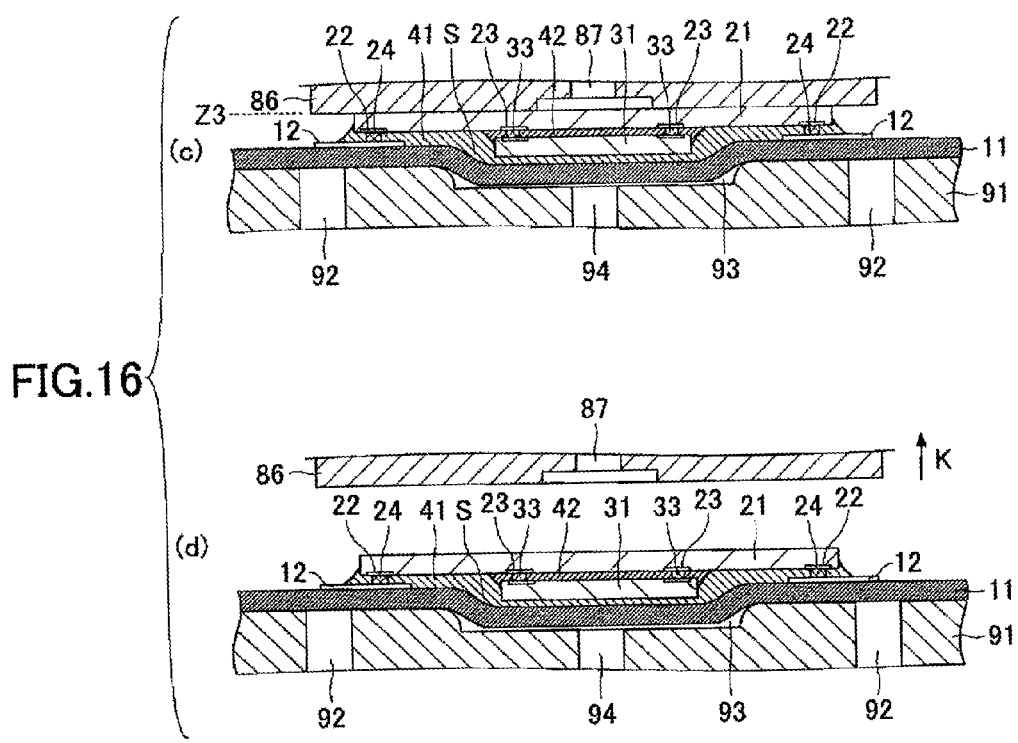
FIG. 16 is a second view illustrating the modified example of the steps illustrated in FIG. 10 and FIG. 11.

A processing method having suction in the concave part 93 is discussed with reference to FIG. 15 and FIG. 16. In FIG. 15 and FIG. 16, parts that are the same as the parts shown in FIG. 10 and FIG. 11 are given the same reference numerals, and explanation thereof is omitted.

In this process method, a suction hole 94 connected to a suction mechanism (not illustrated in FIG. 15 and FIG. 16) is provided at the bottom part of the concave part 93 of the bonding stage 91. By driving the suction mechanism, vacuum suction (decompression) is taken in the concave part 93 via the suction hole 94. As a result of this, a semiconductor element mounting part of the supporting board 11 provided on the bonding stage 91 is selectively suctioned in the concave part 93.

In this process method, the supporting board 11 is held on the bonding stage 91 having the above-discussed structure by suction using the suction hole 92. See FIG. 15(a).

In addition, as discussed above, the concave part 93 has a plane configuration, dimensions, and depth so that the second semiconductor element 31 can be received with a part of the supporting board 11. A bonding stage 91 where the supporting board 11 is mounted and fixed is heated at approximately 50° C. through approximately 100° C. Furthermore, with heating, an inside space of the concave part 93 of the bonding stage 91 is discharged via the suction hole 94.

Plural electrode terminals 12 as a part of the conductive layer formed on the supporting board 11 are provided on the upper surface of the supporting board 11.

The first adhesive 41 is provided in an area on the upper surface of the supporting board 11 surrounded by plural electrode terminals 12. The first adhesive 41 is made of a material whose main ingredient is epoxy group resin and has thermosetting properties.

On the other hand, a rear surface (electronic circuit non-forming surface) of the first semiconductor element 21 where the second semiconductor element 31 is flip chip mounted is suctioned and held to the bonding tool 86 by the absorbing hole 87. The bonding tool 86 is heated, in advance, at a designated temperature such as approximately 270° C. through approximately 300° C.

The outside connection terminals 24 of the first semiconductor element 21 and the electrode terminals 12 of the supporting board 11 are positioned to face to each other.

After the positioning, while heights are controlled, the bonding tool 86 is lowered as indicated by an arrow J in FIG. 15(b) until the outside connection terminals 24 of the first semiconductor element 21 come in contact with the electrode terminals 12 on the supporting board 11 (first pressing by position control).

By lowering the bonding tool 86, the rear surface (electronic circuit non-forming surface) of the second semiconductor element 31 flip chip mounted on the first semiconductor element 21 first comes in contact with the supporting board 11 via the first adhesive 41. The thickness of the second semiconductor element 31 is greater than the height of the outside connection terminal 24 formed on the first outside connection terminal pad 22 of the first semiconductor element 21. Therefore, the outside connection terminals 24 of the first semiconductor element 21 do not come in contact with the electrode terminals 12 on the supporting board 11. In addition, by lowering the bonding tool 86 further, the outside connection terminals 24 of the first semiconductor element 21 come in contact with the electrode terminals 12 on the supporting board 11.

After this, the pressing force generated by lowering of the bonding tool 86 is applied to the supporting board 11 via the first semiconductor element 21, the second semiconductor element 31, and the first adhesive 41.

In other words, by this pressing force, at least a part of the supporting board 11 where the second semiconductor element 31 is mounted and its periphery are pressed in the concave part 93 so as to be extended.

In addition, at this time, the bonding tool 86 configured to take suction on and hold the first semiconductor element 21 is, as discussed above, heated at the designated temperature. Heat from the bonding tool 86 is conducted to the second semiconductor element 31 via the first semiconductor element 21 and the outside connection terminals 24. A part of the supporting board 11 close to the second semiconductor element 31 is locally heated. By this heating, local thermal expansion is generated and progresses at the supporting board 11. Therefore, the supporting board 11 is extended by the pressing force and, by local thermal expansion due to local heating, is easily extended in the concave part 70 and starts bending.

In this process method, by discharging an inside space of the concave part 70 of the bonding stage 65 with pressing and heating, extension and bending of the supporting board 11 progresses.

In other words, an inside space of the concave part 70 is discharged by suction via the suction hole 77 so as to be decompressed. Hence, a part of the supporting board 11 where extension and bending are generated is suctioned and deformation by the extension and bending can progress. In addition, by this discharge, air in the concave part 70 is reduced. Therefore, bending deformation of the supporting board 11 cannot be obstructed by the thermal expansion of the air.

On the other hand, the viscosity of the first adhesive 41 adhered on the supporting board 11 is decreased due to heat from the bonding tool 86 conducted by contact of the supporting board 11 and the second semiconductor element 31 so that flowability of the first adhesive 41 is increased. The first adhesive 41 is pushed and extended in the entire area where the first semiconductor element 21 faces the supporting board 11 between the supporting board 11 and the first semiconductor element 21.

The outside connection terminals 24 formed on the first semiconductor element 21 come in contact with the electrode terminals 12 of the supporting board 11 so as to be connected to the electrode terminals 12. As a result of this, flip chip mounting of the first semiconductor element 21 to the supporting board 11 is accomplished. See FIG. 16(c).

Until the outside connection terminals 24 are connected to the electrode terminals 12, a load detected by the load sensor connected to the bonding tool 86 is maintained. (Second pressing by the load control)

When the first semiconductor element 21 is mounted on the supporting board 11, while a configuration where the supporting board 11 is bent in the concave part 93 of the bonding stage 91 is maintained, the first adhesive 41 is cured. By the adhesive force and shrinkage force on curing of the first adhesive 41, connection between the first semiconductor element 21 and the supporting board 11 via the outside connection terminals 24 is maintained.

Next, suction by the bonding tool 86 is turned off and the bonding tool 85 starts rising as indicated by arrow K in FIG. 16(d).

After that, plural outside connection terminals 13 such as spherical-shaped electrode terminals whose main ingredient is solder are provided on the conductive layer selectively provided on the rear surface of the supporting board 11. As a result of this, the semiconductor device 100 illustrated in FIG. 1 is formed. Thus, in this manufacturing method, an inside space of the concave part 93 on the bonding stage 81 is discharged via the suction hole 94 so as to be decompressed, and the supporting board 11 where a local extension or bending is generated or progressed is dragged by suction into the concave part 93. As a result of this, bending deformation can efficiently progress. In addition, by this discharge, it is possible to prevent obstacles of the bending deformation of the supporting board 11 due to the thermal expansion of the air in the concave part 93. Hence, it is possible to securely form the bending configuration of the supporting board 11.

(Manufacturing Method of the Semiconductor Device 200)

Figure 9:
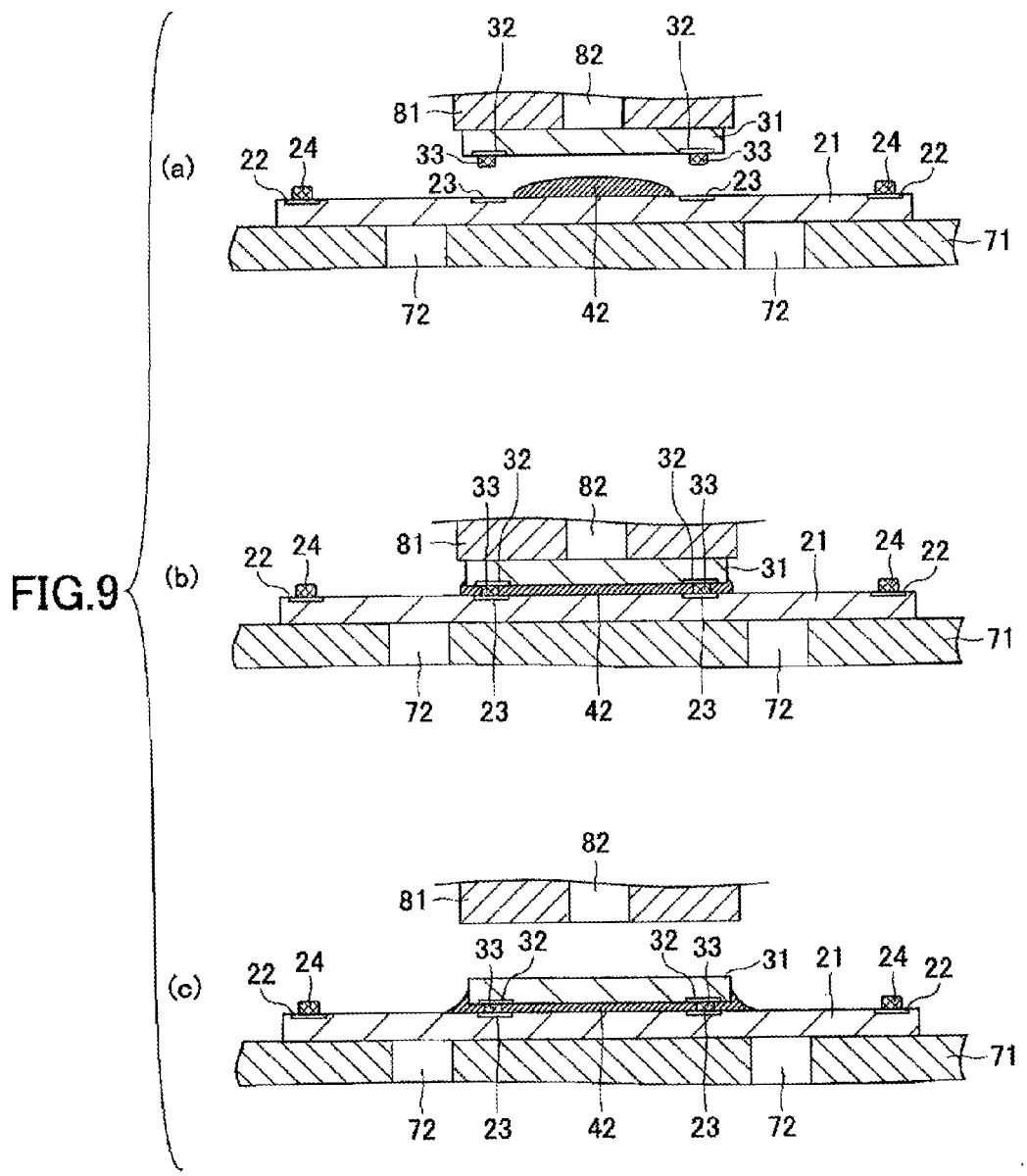
FIG. 9 is a first view illustrating manufacturing steps of the semiconductor device of the first embodiment.
Figure 17:
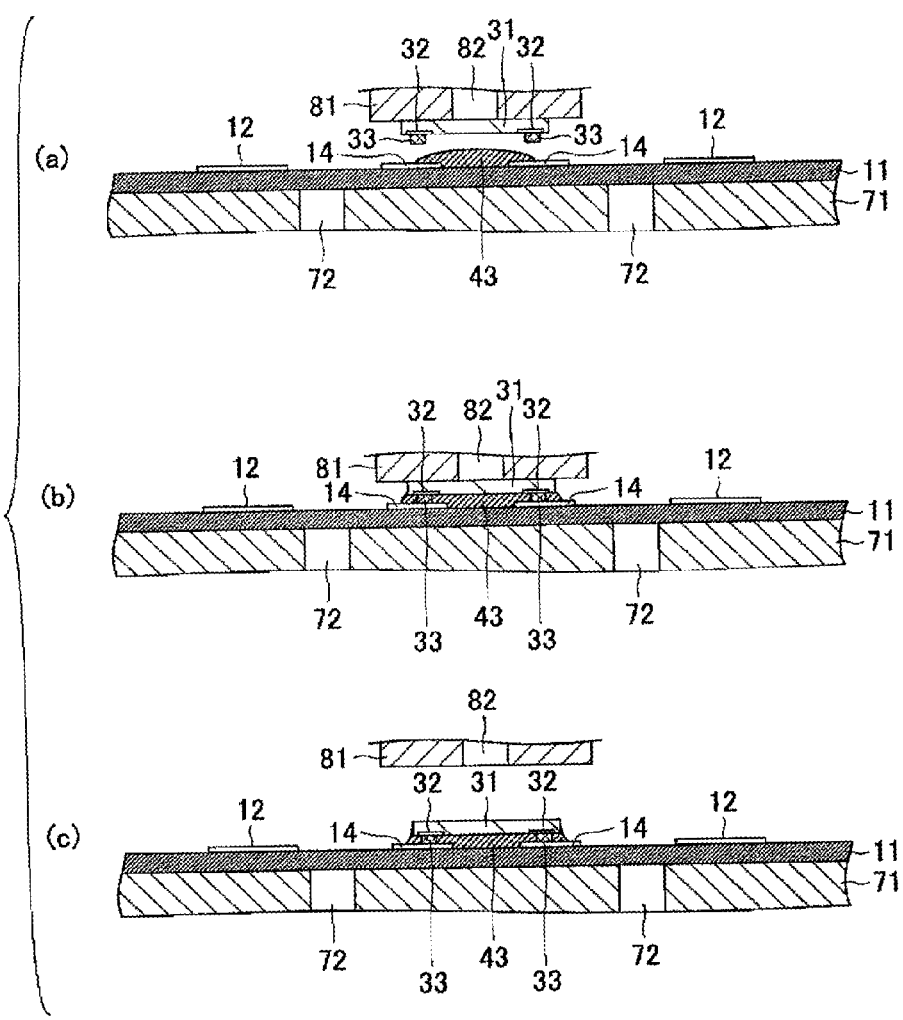
FIG. 17 is a first view illustrating manufacturing steps of the semiconductor device of the second embodiment.
Figure 18:
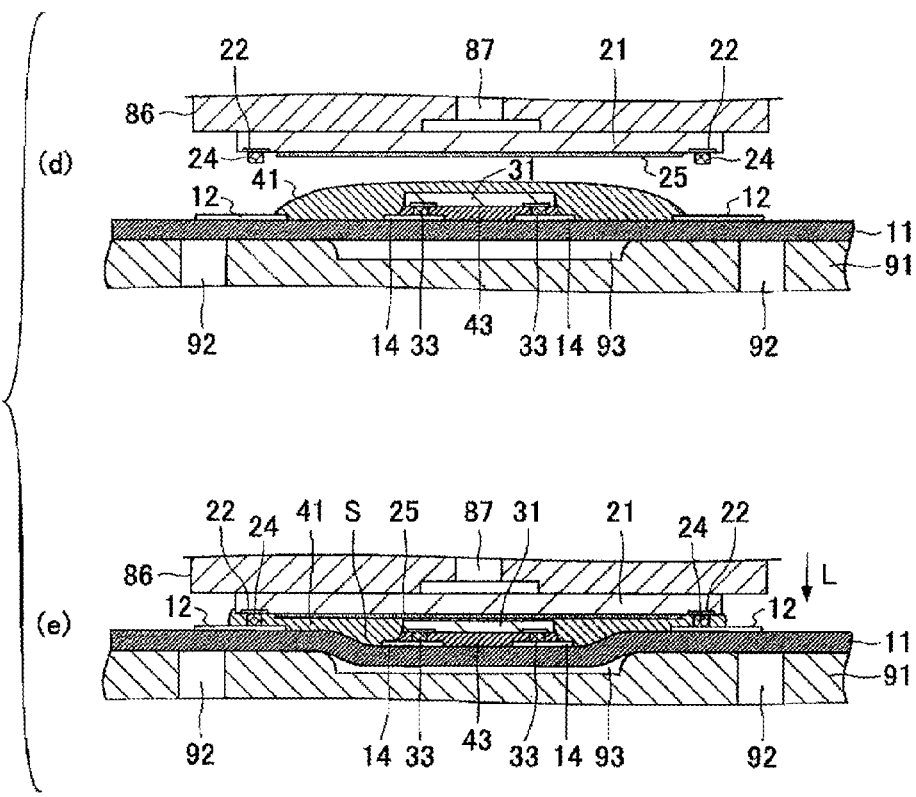
FIG. 18 is a second view illustrating the manufacturing steps of the semiconductor device of the second embodiment.
Figure 19:
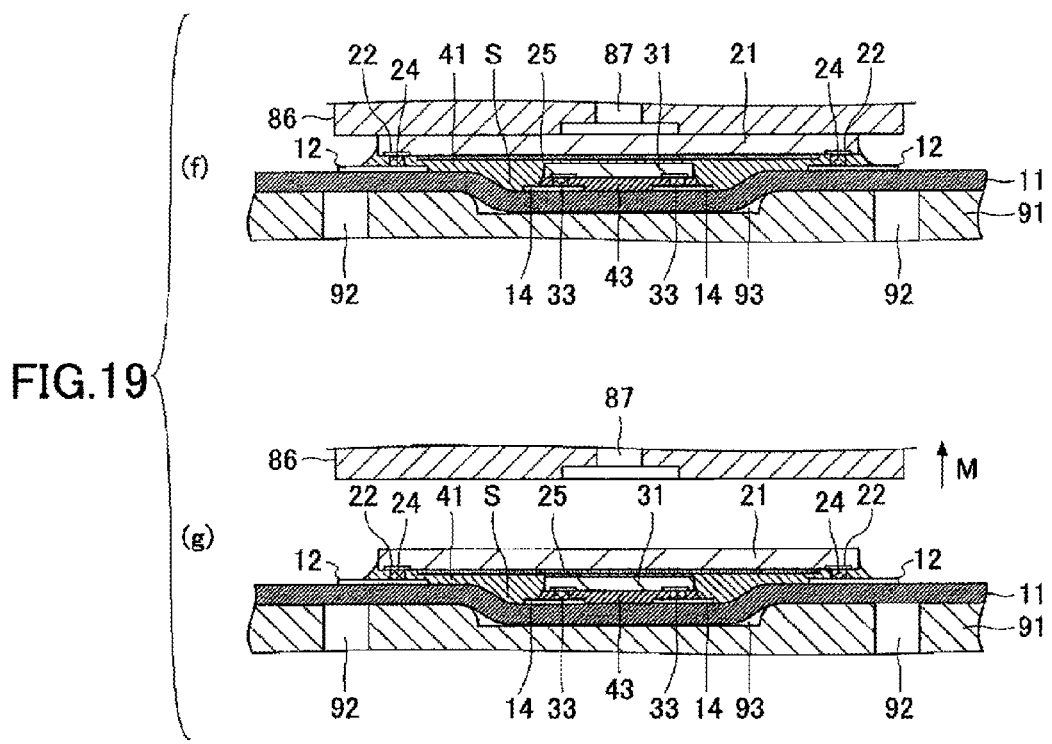
FIG. 19 is a third view illustrating the manufacturing steps of the semiconductor device of the second embodiment.

The manufacturing method of the semiconductor device 200 of the second embodiment is discussed with reference to FIG. 17 through FIG. 19. In FIG. 17 through FIG. 19, parts that are the same as the parts shown in FIG. 9 through FIG. 11 are given the same reference numerals, and explanation thereof is omitted.

In the manufacturing of the semiconductor device 200, first, the second semiconductor element 31 is flip chip mounted on the supporting board 11. A thermal compression bonding method via the adhesive, a connecting method using soldering, a thermal compression bonding method, an ultrasonic connecting method, a connecting method using anisotropic conductive resin, or the like can be applied as the flip chip mounting method.

In this manufacturing method, the second semiconductor element 31 is thermally compressed to the supporting board 11 via the third adhesive 43 so as to be flip chip mounted on the supporting board 11. This is discussed with reference to FIG. 17.

In this manufacturing method, first, the supporting board 11 is sucked and held on the bonding stage 71 by vacuum suction via absorption holes 81. At this time, the main surface (semiconductor element mounting surface) of the supporting board 71 is exposed. See FIG. 17(*a*).

Plural parts of the conductive layer, as the electrode terminals 12, are exposed on the main surface of the supporting board 11. In the area surrounded by the electrode terminals 12, the plural electrode terminals 14 are exposed as a part of the conductive layer of the supporting board 11.

In addition, the third adhesive 43 is provided in the area surrounded by the electrode terminals 14. The third adhesive 43 is made of a thermosetting material whose main ingredient is epoxy group resin.

On the other hand, the rear surface (electronic circuit non-forming surface) of the second semiconductor element 31 is sucked and held by a bonding tool 81 heated at a designated temperature in advance via an absorption hole 82.

The outside connection terminals 33 are provided on the outside connection terminal pads 32 of the second semiconductor element 31. As the outside connection terminal 33, a metal bump formed by a so-called ball bonding method using a wire bonding technique or an electrolytic plating method or a gold bump formed by the electrolytic plating method, a transferring method, a printing method, or the like can be used.

The outside connection terminals 33 of the second semiconductor element 31 and the electrode terminals 14 of the supporting board 11 are made to face each other so as to be positioned.

After that, the bonding tool 81 is lowered so that the outside connection terminals 33 of the second semiconductor element 31 are pushed to the electrode terminals 14 of the supporting board 11 and thereby the outside connection terminals 33 and the electrode terminals 14 come in contact with each other. A designated load is applied to the outside connection terminals 33 of the second semiconductor element 31 by the bonding tool 81 so that the outside connection terminals 33 are connected to the electrode terminals 14 on the supporting board 11. At this time, the third adhesive 43 flows over the entire area of the main surface (the electronic circuit forming surface, a surface facing the supporting board 11) of the second semiconductor element 31 so as to reach a space between the second semiconductor element 31 and the supporting board 11 and a side surface external circumferential part of the second semiconductor element 31.

In addition, the third adhesive 43 is thermally cured by heat from the bonding tool 81. See FIG. 17(*b*).

Thus, the second semiconductor element 31 is flip chip mounted on the supporting board 11.

After that, suction by the bonding tool 81 is turned off and the bonding tool 81 rises. See FIG. 17(*c*).

Next, the first semiconductor element 21 is flip chip mounted on the supporting board 11 so as to be stacked on the second semiconductor element 31.

A step of flip chip mounting the first semiconductor element 21 on the supporting board 11 is discussed with reference to FIG. 18 and FIG. 19.

In this example, a thermal compression bonding method via the first adhesive 41 is used as a method of flip chip mounting the first semiconductor element 21 on the supporting board 11. As the flip chip mounting method, as for heating and pressing by using the bonding tool configured to absorb and hold the first semiconductor element 21, a thermal compression bonding method via the adhesive, a connecting method using soldering, a thermal compression bonding method, an ultrasonic connecting method, a connecting method using anisotropic conductive resin, or the like can be used.

First, the supporting board 11 is sucked and held on the bonding stage 91 by vacuum suction via absorption holes 92.

In the embodiment, the concave part 93 is selectively provided in the bonding stage 91.

The concave part 93 has a plane configuration, dimensions, and depth whereby the second semiconductor element 31 with a part of the supporting board 11 is received.

The supporting board 11 is suctioned and held on the bonding stage 91 so that the second semiconductor element 31 is positioned in the substantially center part of the concave part 93. The bonding stage 91 where the supporting board 11 is mounted is heated at approximately 50° C. through approximately 100° C.

An internal side surface 93*a* of the concave part 93 extends from a plane concave part bottom surface 93*b* to an upper surface to an upper surface. The internal side surface 93*a* has an arc-shaped cross section which is a convex shape toward an inside of the concave part 93. The concave part 93 having the arc-shaped cross section has the internal side surface opening upward. Therefore, when the supporting board 11 extends and is bent so as to come in contact with the internal side surface of the concave part 93, it is possible to prevent or reduce the concentration of the stress to a specific portion of the supporting board 11. Hence, it is possible to prevent future generation of damage to the wiring in the supporting board 11.

The bottom surface 93*b* of the concave part 93 is flat. The depth of the concave part 93 is set so that the lower side surface (second main surface) of the supporting board 11 comes in contact with the bottom surface of the concave part 93 when the second semiconductor element 31 is received in the thickness direction of the second semiconductor element 31 and the supporting board 11 extends and is bent. As a result of this, the amount of bending of the supporting board 11 is limited and the lower side surface of the supporting board 11 has a flat surface.

A configuration of the internal side surface of the concave part 93 is not limited to the example illustrated in FIG. 13. An example illustrated in FIG. 14 can be applied.

The first adhesive 41 is provided in the area surrounded by plural electrode terminals 12 on the upper surface of the supporting board suctioned and held on the bonding stage 91 so as to cover the second semiconductor element 31. The first adhesive 41 is made of the thermosetting material whose main ingredient is, for example, epoxy group resin. See FIG. 18(*d*).

Covering with the first adhesive 41 may be continuously performed on the bonding stage 91 after the second semiconductor element 31 is flip chip mounted on the supporting board 11.

On the other hand, the second main surface (rear surface, electronic circuit non-forming surface) of the first semiconductor element 21 is suctioned and held to the bonding tool 86 via the absorption hole 87. The bonding tool 86 is heated at designated temperature (approximately 270° C. through approximately 300° C.).

The convex shaped outside connection terminals 24 are provided on the first outside connection terminal pads 22 of the first semiconductor element 21.

An insulation layer 25 is provided in an area surrounded by the first outside connection terminal pads 22 of the electronic circuit forming surface of the first semiconductor element 21. The insulation layer 25 having elasticity is made of a material whose main ingredient is, for example, polyimide group resin, silicon group resin, or epoxy group resin. The insulation layer 25 has thickness of, for example, approximately 1 μm through approximately 15 μm.

The outside connection terminals 24 of the first semiconductor element 21 and the electrode terminals 12 of the supporting board 11 are made to face each other so as to be positioned.

At this time, the first semiconductor element 21 is above the second semiconductor element 31. The main surface (electronic circuit forming surface) of the first semiconductor element 21 faces the rear surface (electronic circuit non-forming surface) of the second semiconductor element 31. While height positions are controlled, the bonding tool 86 is lowered as indicated by an arrow L in FIG. 18(*e*) until the outside connection terminals 24 of the first semiconductor element 21 come in contact with the electrode terminals 12 on the supporting board 11 (first pressing by position control).

Because of this, a designated load is applied to the outside connection terminals 24 of the first semiconductor element 21 by the bonding tool 86, so that the outside connection terminals 24 of the first semiconductor element 21 are connected to the electrode terminals 12 of the supporting board 11. At this time, simultaneously, the first semiconductor element 21 is pressed to the rear surface of the second semiconductor element 31 via the insulation layer 25 provided on the surface of the first semiconductor element 21.

Accordingly, the pressing force accompanied by lowering the bonding tool 86 is applied to the supporting board 11 via the first semiconductor element 21, the second semiconductor element 31, and the first adhesive 41.

By this pressing force, a part of the supporting board 11 corresponding to at least the second semiconductor element 31 mounting part and its periphery is pressed into the concave part 93 of the bonding stage 91 so as to extend.

At this time, the bonding tool 86 is, as discussed above, heated at a designated temperature.

Heat from the bonding tool 86 is conducted to the supporting board 11 via the first semiconductor element 21 and the second semiconductor element 31, and thereby the supporting board 11 is locally heated. By this heat, local thermal expansion is generated and progresses at the supporting board 11 so that the supporting board 11 is easily expanded in the concave part 93 of the bonding stage 91 and begins bending.

The viscosity of the first adhesive 41 adhered on the supporting board 11 is decreased due to heat from the bonding tool 86 conducted by contact of the supporting board 11 and the second semiconductor element 31 so that flowability of the first adhesive 41 is increased. Accordingly, the first adhesive 41 is pushed and extended in the entire area of the first semiconductor element 21 between the supporting board 11 and the first semiconductor element 21, and thermosetting progresses.

Until the outside connection terminals 24 of the first semiconductor element 21 are connected to the electrode terminals 12 of the supporting board 11 and the flip chip mounting of the first semiconductor element 21 on the supporting board 11 is completed, a load detected by the load sensor connected to the bonding tool 86 is maintained. See FIG. 19(*f*) (Second pressing by the load control).

Since the insulation layer 25 provided on the electronic circuit forming surface of the first semiconductor element 21 has elasticity, it is possible to prevent the electronic circuit forming part of the first semiconductor element 21 from being damaged due to a load applied to the first semiconductor element 21 at the time of flip chip mounting. In other words, the insulation layer 25 functions as a stress relief layer configured to prevent damage to the main surface (electronic circuit forming surface) of the first semiconductor element 21 by reliving the stress acting on the first semiconductor element 21 from the rear surface of the second semiconductor element 31 when the first semiconductor element 21 is stacked on the second semiconductor element 31 and flip chip mounted on the supporting board 11.

When the first semiconductor element 21 is mounted on the supporting board 11, while a configuration where the supporting board 11 is bent in the concave part 93 of the bonding stage 91 is maintained, the first adhesive 41 is cured. By the adhesive force and shrinkage force for curing of the first adhesive 41, connection between the first semiconductor element 21 and the supporting board 11 via the outside connection terminals 24 is maintained.

Next, suction by the bonding tool 86 is turned off and the bonding tool 86 starts rising as indicated by arrow M in FIG. 19(*g*).

After that, plural outside connection terminals 13 such as spherical-shaped electrode terminals whose main ingredient is solder are provided on the conductive layer selectively provided on the rear surface of the supporting board 11. As a result of this, the semiconductor device 200 illustrated in FIG. 4 is formed.

Thus, in this manufacturing method, pressing to the supporting board 11 by the bonding tool 86 is performed on the bonding stage 91 having the concave part 93 and supporting the supporting board 11 is performed via the first semiconductor element 21 flip chip mounted on the supporting board 11 and the second semiconductor element 31 flip chip mounted on the supporting board 11. As a result of this, the supporting board 11 is locally pressed into the concave part 93. In addition, the supporting board 11 is locally heated by heat conducted from the bonding tool 86 to the first semiconductor element 21 and the second semiconductor element 31.

As a result of this, the supporting board 11 is expanded and bent in the concave part 93 of the bonding stage 91. In other words, the concave part S where the second semiconductor element 31 can be received is formed in the supporting board 11 by local expansion or bending of the supporting board 11 generated by local pressing or heating. Therefore, since the second semiconductor element 31 can be received in the thickness direction of the second semiconductor element 31 in the concave part S, while two semiconductor elements 21 and 31 are stacked on the supporting board 11, there is no substantial increase of thickness corresponding to the entire thickness of the second semiconductor element 31.

In the manufacturing method of this embodiment, it is possible to manufacture the semiconductor device having plural semiconductor elements, the first semiconductor element 21 and the second semiconductor element 31, and the required thinness and small size, with a simple process, so that the manufacturing cost can be reduced.

While the height position of the bonding tool 86 is controlled, the bonding tool 86 is lowered so that the outside connection terminals 24 of the first semiconductor element 21 come in contact with the electrode terminals 12 of the supporting board 11. After that, the load of the bonding tool 86 is controlled and thereby the load is applied to the outside connection terminals 24. By this pressing or application of the load, the outside connection terminals 24 are securely connected to the electrode terminals 12 of the supporting board 11 so that the mounting structure with high connection reliability can be obtained.

After the second semiconductor element 31 is flip chip mounted on the supporting board 11, a post cure process may be applied so that the third adhesive 43 provided between the second semiconductor element 31 and the supporting board 11 may be cured.

In this manufacturing method, the absorption hole 94 connected to the suctioning mechanism may be provided at the bottom part of the concave part 93 provided on the bonding stage 91. While the inside of the concave part 93 is discharged and decompressed, the first semiconductor element 21 can be flip chip mounted on the supporting board 11.

(Manufacturing Method of the Semiconductor Device 300)

Figure 20:
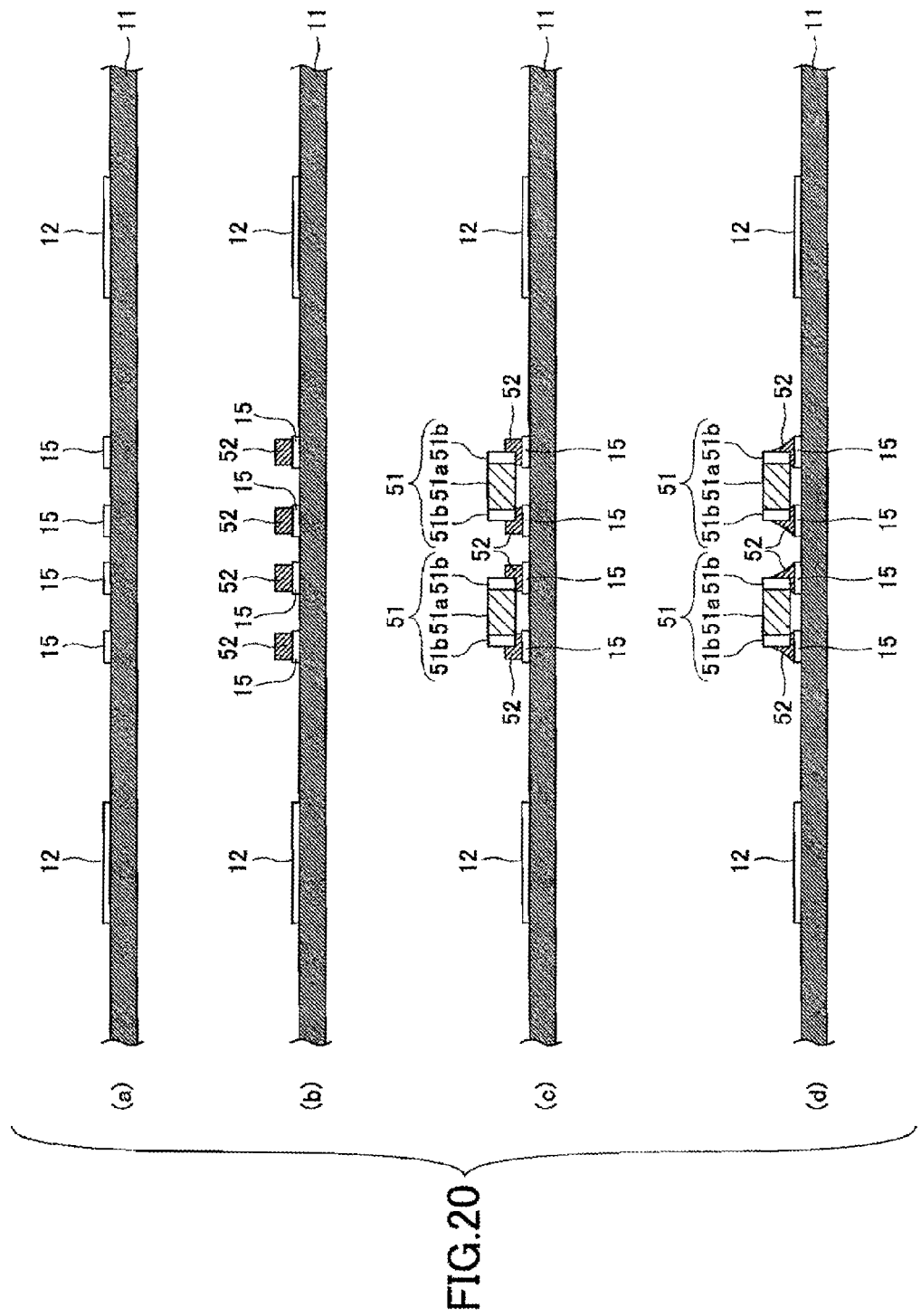
FIG. 20 is a first view illustrating manufacturing steps of the semiconductor device of the third embodiment.
Figure 21:
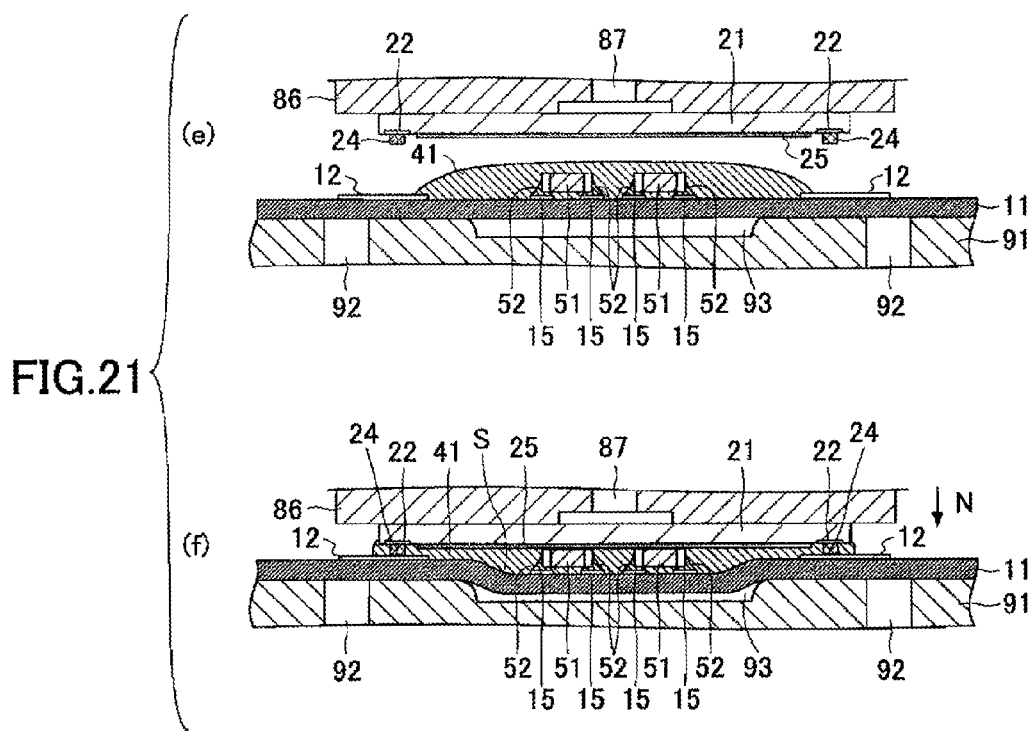
FIG. 21 is a second view illustrating the manufacturing steps of the semiconductor device of the third embodiment.
Figure 22:
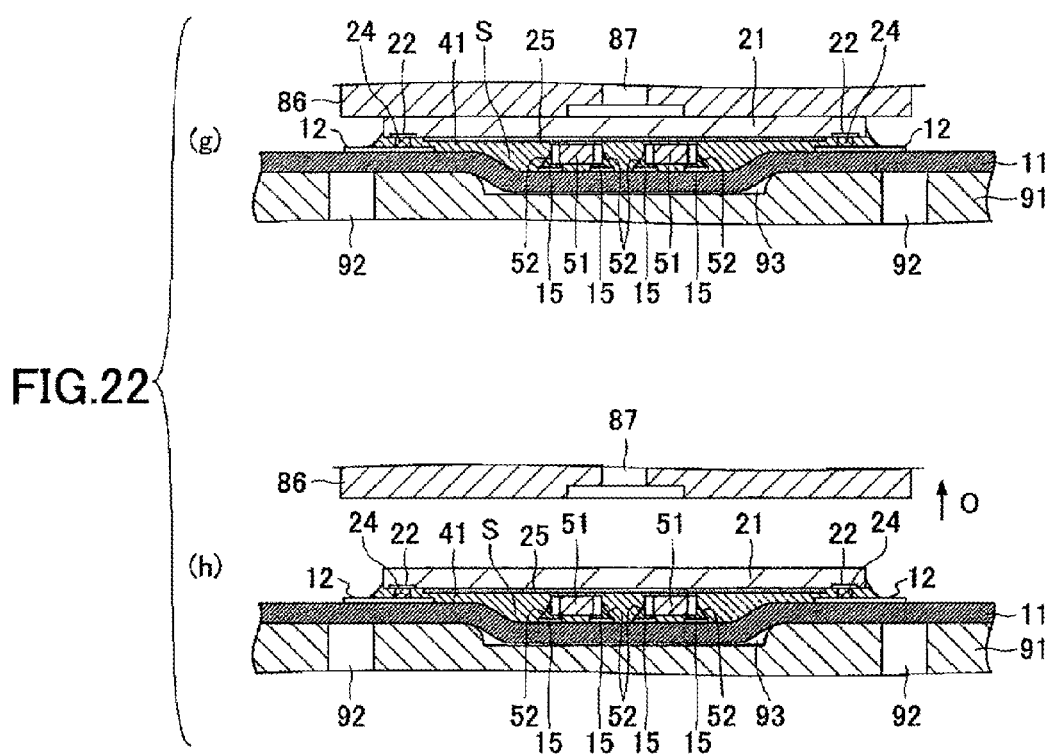
FIG. 22 is a third view illustrating the manufacturing steps of the semiconductor device of the third embodiment.

The manufacturing method of the semiconductor device 300 of the third embodiment is discussed with reference to FIG. 20 through FIG. 22. In FIG. 20 through FIG. 22, parts that are the same as the parts shown in FIG. 9 through FIG. 11 are given the same reference numerals, and explanation thereof is omitted.

In manufacturing of the semiconductor device 300, the passive elements 51 are connected to the electrode terminals 15 of the supporting board 11 in advance. This manufacturing step is illustrated in FIG. 20.

In other words, a part of the conductive layer is provided on one of the main surfaces of the supporting board 11 as plural electrode terminals 12. Plural electrode terminals 15 are provided in the area surrounded by the electrode terminals 12. See FIG. 20(*a*).

Furthermore, for example, silver (Ag) paste resin is provided on the electrode terminals 15 by using a printing method using a metal mask so that the conductive adhesive 52 is provided. See FIG. 20(*b*).

The silver (Ag) paste resin may be provided by a method of jetting the silver (Ag) paste resin from a nozzle. As the conductive adhesive 52, for example, a conductive adhesive where conductive particles of silver (Ag), gold (Au), copper (Cu), nickel (Ni), carbon black, or the like are contained in epoxy group resin or silicon group resin, or a solder material such as solder of zinc (Sn) and silver (Ag), or solder of zinc (Sn), silver (Ag), and copper (Cu), may be used.

Next, the passive elements 51 are mounted and fixed on the electrode terminals 15 on the supporting board 11 via the conductive adhesive 52 by using a so-called chip mounter or the like. See FIG. 20(*c*).

The passive element 51 is a so-called chip component having a plate-shaped configuration or a pillar-shaped configuration. For example, a capacitance element functioning as a bypass capacitor, an inductor functioning as a noise filter, a resistance element, or the like is applied to the passive element. The passive element 51 includes an insulating element body part 51*a* and plural electrode terminals 51*b* provided on edge parts or a single main surface of the insulating element body part 51*a*. The passive element 51 is properly selected based on a circuit structure, size, or the like of the first semiconductor element 21.

The electrode terminals 51*b* of the passive element 51 and the electrode terminals 15 of the supporting board 11 are electrically and mechanically connected to each other via the conductive adhesive 52.

After that, by heating with an oven or the like or irradiation of ultraviolet rays or the like, the conductive adhesive 52 is cured so that the passive elements 51 are mounted on the supporting board 11. See FIG. 20(*d*).

Next, in this manufacturing method, the first semiconductor element 21 is flip chip mounted on the supporting board 11 where the passive elements 51 are mounted.

A step of flip chip mounting the first semiconductor element 21 on the supporting board 11 is discussed with reference to FIG. 21 and FIG. 22.

In this example, a thermal compression bonding method via the first adhesive 41 is used as a method of flip chip mounting the first semiconductor element 21 on the supporting board 11. As the flip chip mounting method, as for heating and pressing by using the bonding tool 86 configured to take suction on and hold the semiconductor element 21, a thermal compression bonding method via adhesive, a connecting method using soldering, a thermal compression bonding method, an ultrasonic connecting method, a connecting method using anisotropic conductive resin, or the like can be used.

First, the supporting board 11 is attracted and held on the bonding stage 91 by vacuum suction via absorption holes 92.

In the embodiment, the concave part 93 is selectively provided in the bonding stage 91. The concave part 93 has a plane configuration, dimensions, and depth whereby the passive elements 51 with a part of the supporting board 11 are received.

The supporting board 11 is suctioned and held on the bonding stage 91 so that the passive elements 51 are positioned in the substantially center part of the concave part 93. The bonding stage 91 where the supporting board 11 is mounted is heated at approximately 50° C. through approximately 100° C.

An internal side surface 93*a* of the concave part 93 extends from a plane concave part bottom surface 93*b* to an upper surface. The internal side surface 93*a* has an arc-shaped cross section which is a convex shape toward an inside of the concave part 93. The concave part 93 having the arc-shaped cross section has the internal side surface opening upward. Therefore, when the supporting board 11 extends and is bent so as to come in contact with the internal side surface of the concave part 93, it is possible to prevent or reduce the concentration of the stress to a specific portion of the supporting board 11. Hence, it is possible to prevent future generation of damage to the wiring in the supporting board 11.

The bottom surface 93*b* of the concave part 93 is flat. The depth of the concave part 93 is set so that the lower side surface (second main surface) of the supporting board 11 comes in contact with the bottom surface of the concave part 93 when the second semiconductor element 31 is received in the thickness direction of the second semiconductor element 31 and the supporting board 11 extends and is bent. As a result of this, the amount of bending of the supporting board 11 is limited and the lower side surface of the supporting board 11 has a flat surface.

A configuration of the internal side surface of the concave part 93 is not limited to the example illustrated in FIG. 13. An example illustrated in FIG. 14 can be applied.

The first adhesive 41 is provided in the area surrounded by plural electrode terminals 12 on the upper surface of the supporting board 11 suctioned and held on the bonding stage 91 so as to cover the passive elements 51. The first adhesive 41 is made of the thermosetting material whose main ingredient is, for example, epoxy group resin. See FIG. 21(e).

Covering with the first adhesive 41 may be continuously performed on the bonding stage 91 after the passive elements 51 are flip chip mounted on the supporting board 11.

On the other hand, the second main surface (rear surface, electronic circuit non-forming surface) of the semiconductor element 21 is suctioned and held to the bonding tool 86 via the absorption hole 87. The bonding tool 86 is heated at a designated temperature (approximately 270° C. through approximately 300° C.).

The convex shaped outside connection terminals 24 are provided on the first outside connection terminal pads 22 of the semiconductor element 21.

The insulation layer 25 is provided in an area surrounded by the first outside connection terminal pads 22 of the electronic circuit forming surface of the first semiconductor element 21. The insulation layer 25 having elasticity is made of a material whose main ingredient is, for example, polyimide group resin, silicon group resin, or epoxy group resin. The insulation layer 25 has thickness of, for example, approximately 1 µm through approximately 15 µm.

The outside connection terminals 24 of the semiconductor element 21 and the electrode terminals 15 of the supporting board 11 are made to face each other so as to be positioned.

At this time, the semiconductor element 21 is above the passive elements 51. The main surface (electronic circuit forming surface) of the semiconductor element 21 faces the passive elements 51. While height positions are controlled, the bonding tool 86 is lowered as indicated by an arrow N in FIG. 21(f) until the outside connection terminals 24 of the semiconductor element 21 come in contact with the electrode terminals 12 on the supporting board 11 (first pressing by position control).

Because of this, a designated load is applied to the outside connection terminals 24 of the first semiconductor element 21 by the bonding tool 86, so that the outside connection terminals 24 of the semiconductor element 21 are connected to the electrode terminals 12 of the supporting board 11. At this time, simultaneously, the first semiconductor element 21 presses the passive elements 51 via the insulation layer 25 provided on the surface of the first semiconductor element 21.

Accordingly, the pressing force accompanied by lowering the bonding tool 86 is applied to the supporting board 11 via the first semiconductor element 21, the passive elements 51, and the first adhesive 41.

By this pressing force, a part of the supporting board 11 corresponding to at least the passive elements 51 mounting part and its periphery is pressed into the concave part 93 of the bonding stage 91 so as to extend.

At this time, the bonding tool 86 is, as discussed above, heated at a designated temperature.

Heat from the bonding tool 86 is conducted to the supporting board 11 via the first semiconductor element 21 and the passive elements 51, and thereby the supporting board 11 is locally heated. By this heat, local thermal expansion is generated and progresses at the supporting board 11 so that the supporting board 11 is easily expanded in the concave part 93 of the bonding stage 91 and begins bending.

The viscosity of the first adhesive 41 adhered on the supporting board 11 is decreased due to heat from the bonding tool 86 conducted by contact of the supporting board 11 and the first semiconductor element 21 so that flowability of the adhesive 41 is increased. Accordingly, the first adhesive 41 is pushed and extended in the entire area of the first semiconductor element 21 between the supporting board 11 and the first semiconductor element 21, and thermosetting progresses.

Until the outside connection terminals 24 of the semiconductor element 21 are connected to the electrode terminals 12 of the supporting board 11 and the flip chip mounting of the first semiconductor element 21 on the supporting board 11 is completed, a load detected by the load sensor connected to the bonding tool 86 is maintained. See FIG. 22(g) (Second pressing by the load control).

Since the insulation layer 25 provided on the electronic circuit forming surface of the first semiconductor element 21 has elasticity, it is possible to prevent the electronic circuit forming part of the first semiconductor element 21 from being damaged due to a load applied to the first semiconductor element 21 at the time of flip chip mounting. In other words, the insulation layer 25 functions as a stress relief layer configured to prevent damage of the main surface (electronic circuit forming surface) of the first semiconductor element 21 by relieving the stress acting on the first semiconductor element 21 from the rear surface of the passive elements 51 when the first semiconductor element 21 is stacked on the passive elements 51 and flip chip mounted on the supporting board 11.

When the first semiconductor element 21 is mounted on the supporting board 11, while a configuration where the supporting board 11 is bent in the concave part 93 of the bonding stage 91 is maintained, the first adhesive 41 is cured. By the adhesive force and shrinkage force on curing of the first adhesive 41, connection between the first semiconductor element 21 and the supporting board 11 via the outside connection terminals 24 is maintained.

Next, suction by the bonding tool 86 is turned off and the bonding tool 86 starts rising as indicated by arrow O in FIG. 22(h).

After that, plural outside connection terminals 13 such as spherical-shaped electrode terminals whose main ingredient is solder are provided on the conductive layer selectively provided on the rear surface of the supporting board 11. As a result of this, the semiconductor device 300 illustrated in FIG. 7 is formed.

Thus, in this manufacturing method, pressing to the supporting board 11 by the bonding tool 86 is performed on the bonding stage 91 having the concave part 93 and supporting the supporting board 11 is performed via the first semiconductor element 21 flip chip mounted on the supporting board 11 and the passive elements 51 flip chip mounted on the supporting board 11. As a result of this, the supporting board 11 is locally pressed in the concave part 93. In addition, the supporting board 11 is locally heated by heat conducted from the bonding tool 86 to the first semiconductor element 21 and the passive elements 51.

As a result of this, the supporting board 11 is expanded and bent in the concave part 93 of the bonding stage 91. In other words, the concave part S where the passive elements 51 can be received is formed in the supporting board 11 by local expansion or bending of the supporting board 11 generated by local pressing or heating. Therefore, since the passive elements 51 can be received in the thickness direction of the passive elements 51 in the concave part S, while the first semiconductor element 21 and the passive elements 51 are stacked on the supporting board 11, there is no substantial increase of thickness corresponding to the entire thickness of the passive elements 51.

In the manufacturing method of this embodiment, it is possible to manufacture the semiconductor device having plural electronic components, the first semiconductor element 21 and the passive elements 51, and being thin and small sized, with a simple process, so that the manufacturing cost can be reduced.

While the height position of the bonding tool 86 is controlled, the bonding tool 86 is lowered so that the outside connection terminals 24 of the first semiconductor element 21 come in contact with the electrode terminals 12 of the supporting board 11. After that, the load of the bonding tool 86 is controlled and thereby the load is applied to the outside connection terminals 24. By this pressing or application of the load, the outside connection terminals 24 are securely connected to the electrode terminals 12 of the supporting board 11 so that the mounting structure with high connection reliability can be obtained.

In this manufacturing method, the absorption hole 94 connected to the suctioning mechanism may be provided at the bottom part of the concave part 93 provided on the bonding stage 91. While the inside of the concave part 93 is discharged and decompressed, the semiconductor element 21 can be flip chip mounted on the supporting board 11.

(Manufacturing Method of the Semiconductor Device 400)

Figure 23:
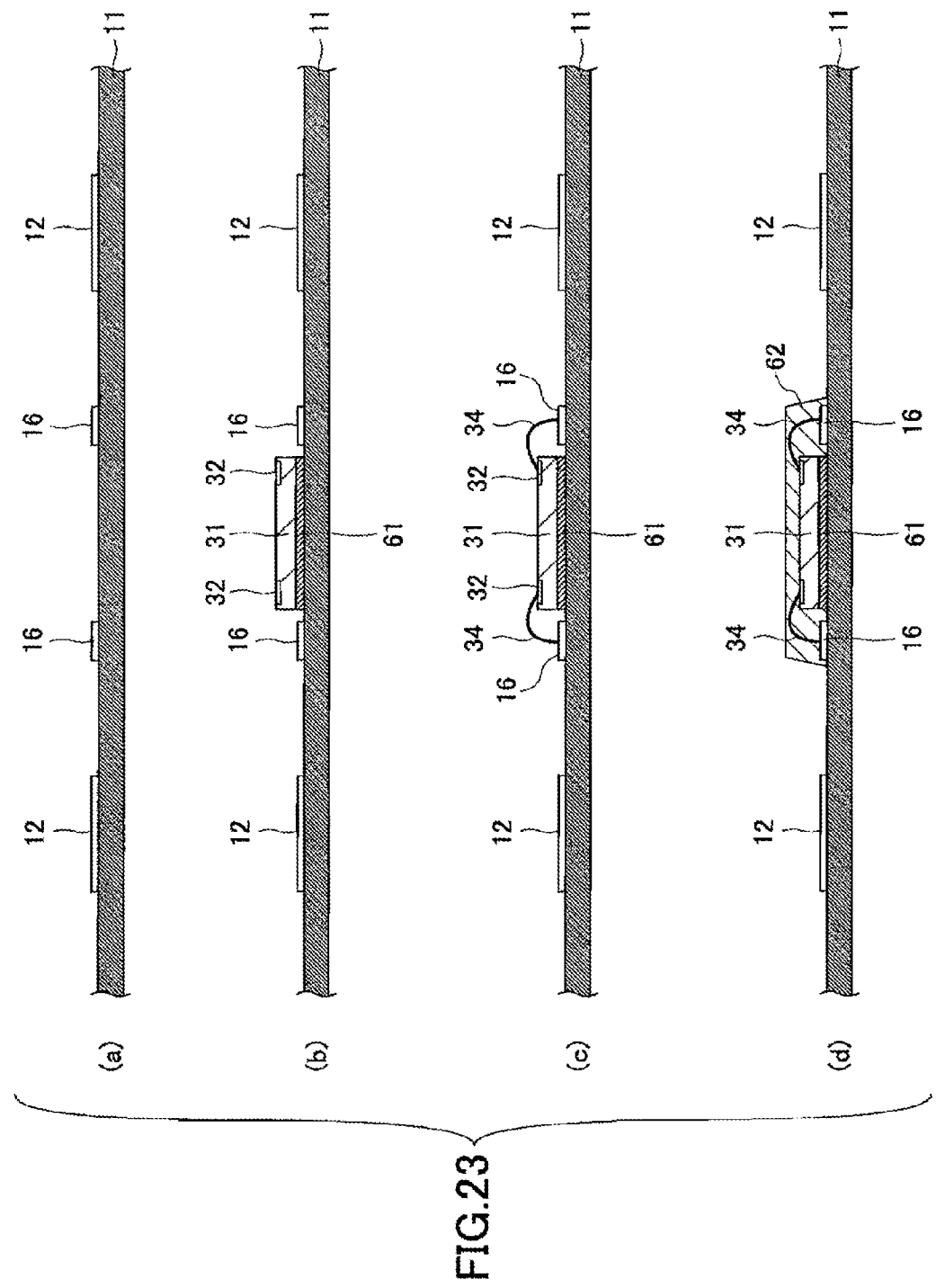
FIG. 23 is a first view illustrating manufacturing steps of the semiconductor device of the fourth embodiment.
Figure 24:
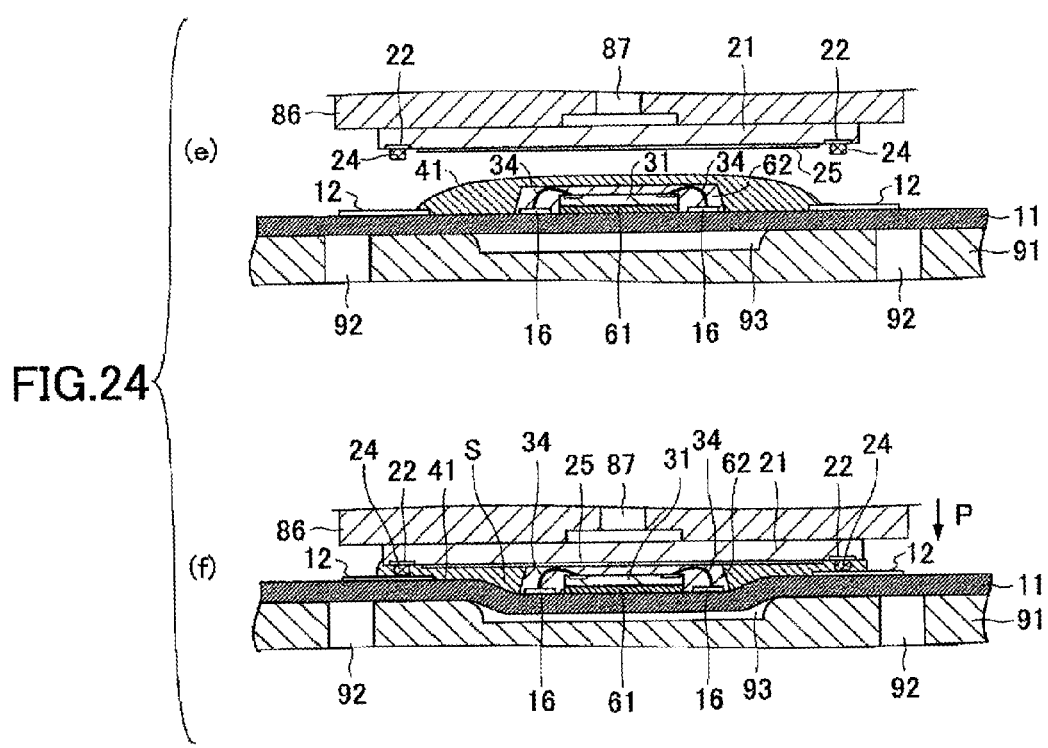
FIG. 24 is a second view illustrating the manufacturing steps of the semiconductor device of the fourth embodiment.
Figure 25:
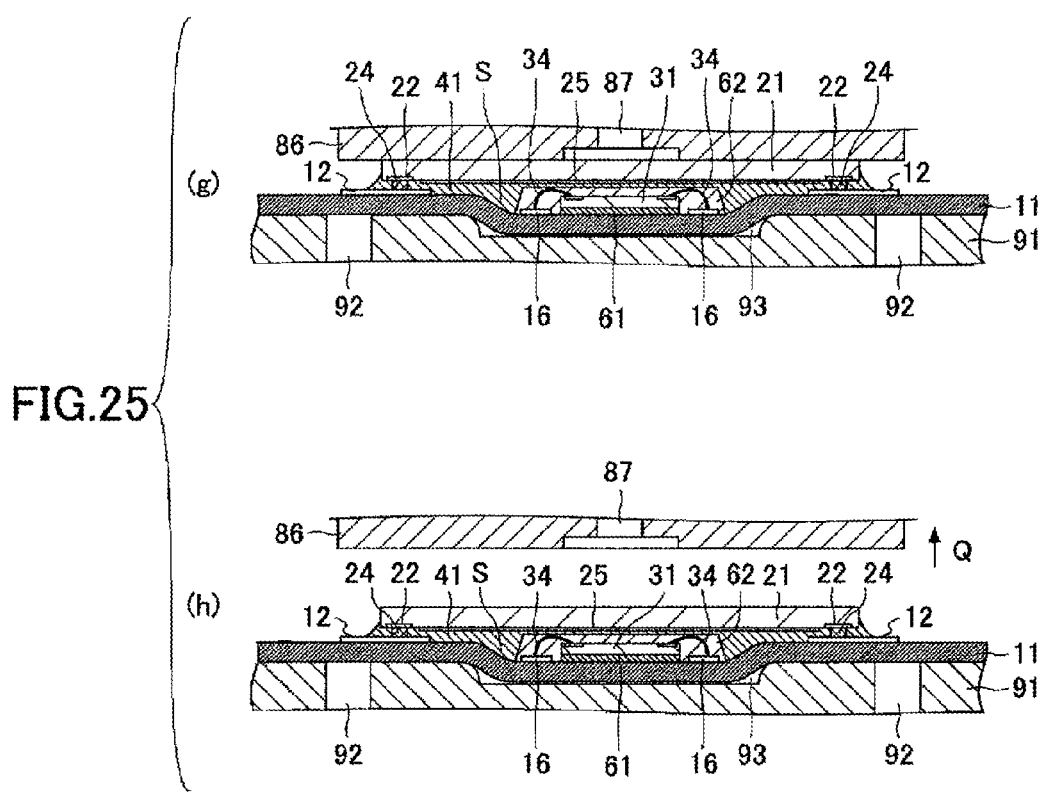
FIG. 25 is a third view illustrating the manufacturing steps of the semiconductor device of the fourth embodiment.

The manufacturing method of the semiconductor device 400 of the fourth embodiment is discussed with reference to FIG. 23 through FIG. 25. In FIG. 23 through FIG. 25, parts that are the same as the parts shown in FIG. 9 through FIG. 11 are given the same reference numerals, and explanation thereof is omitted.

In the manufacturing of the semiconductor device 400, first, the second semiconductor element 31 is flip chip mounted on the supporting board 11 and is sealed by resin. Such a mounting and sealing step is illustrated in FIG. 23.

In other words, on one of the main surfaces of the supporting board 11, a part of the conductive layer as plural electrode terminals 12 is exposed and plural electrode terminals 16 are exposed in an area surrounded by the electrode terminals 12. See FIG. 23(a).

Next, the semiconductor element 31 is mounted and fixed on an area on the supporting board 11 surrounded by the electrode terminals 16 via the die bonding member 61 where the main surface (electronic circuit forming surface) of the second semiconductor element 31 faces upward. See FIG. 23(b).

The outside connection terminal pads 32 are provided on the main surface of the second semiconductor element 31 so as to surround the electronic circuit forming part. A so-called die bonder is used for die bonding the second semiconductor element 31. The bonding member 61 is made of, for example, a material whose ingredient is polyimide group resin or epoxy group resin.

Next, the outside connection terminal pads 32 formed on the circuit forming surface of the second semiconductor element 31 and the electrode terminals 16 of the supporting board 11 are connected to each other by bonding wires 34 made of metal whose main ingredient is gold (Au), copper (Cu), or the like. See FIG. 23(c).

A double layer plating layer of nickel (Ni) and gold (Au) from a lower layer in this order may be formed on surfaces of the outside connection terminal pads 32 provided on the main surface of the second semiconductor element 31 by an electroless plating method.

After that, a resin molding method such as a transfer molding method or a compression molding method, or a potting method is applied so that the second semiconductor element 31, the bonding wires 34, and the electrode terminals 16 are sealed by the sealing resin 62. See FIG. 23(d).

A material whose ingredient is, for example, epoxy group resin, is used as the sealing resin 62.

In this manufacturing method, the second semiconductor element 31 is mounted in a so-called face-up state, and the first semiconductor element 21 is flip chip mounted on the supporting board 11 which is sealed by resin with the second semiconductor element 31 and the bonding wires 34.

A step of flip chip mounting the first semiconductor element 21 on the supporting board 11 is discussed with reference to FIG. 24 and FIG. 25.

In this example, a thermal compression bonding method via the first adhesive 41 is used as a method of flip chip mounting the first semiconductor element 21 on the supporting board 11. As the flip chip mounting method, as for heating and pressing by using the bonding tool 86 configured to take suction on and hold the first semiconductor element 21, a thermal compression bonding method via the adhesive, a connecting method using soldering, a thermal compression bonding method, an ultrasonic connecting method, a connecting method using anisotropic conductive resin, or the like can be used.

First, the supporting board 11 is attracted and held on the bonding stage 91 by vacuum suction via absorption holes 92.

In the embodiment, the concave part 93 is selectively provided in the bonding stage 91. The concave part 93 has a plane configuration, dimensions, and depth whereby the second semiconductor element 31 with a part of the supporting board 11 is received.

The supporting board 11 is suctioned and held on the bonding stage 91 so that the second semiconductor element 31 is positioned in the substantially center part of the concave part 93. The bonding stage 91 where the supporting board 11 is mounted is heated at approximately 50° C. through approximately 100° C.

An internal side surface 93a of the concave part 93 extends from a plane concave part bottom surface 93b to an upper surface. The internal side surface 93a has an arc-shaped cross section which is a convex shape toward an inside of the concave part 93. The concave part 93 having the arc-shaped cross section has the internal side surface opening upward. Therefore, when the supporting board 11 extends and is bent so as to come in contact with the internal side surface of the concave part 93, it is possible to prevent or reduce the concentration of the stress to a specific portion of the supporting board 11. Hence, it is possible to prevent future generation of damage to the wiring in the supporting board 11.

The bottom surface 93b of the concave part 93 is flat. The depth of the concave part 93 is set so that the lower side surface (second main surface) of the supporting board 11 comes in contact with the bottom surface of the concave part 93 when the second semiconductor element 31 is received in the thickness direction of the second semiconductor element 31 and the supporting board 11 extends and is bent. As a result of this, the amount of bending of the supporting board 11 is limited and the lower side surface of the supporting board 11 has a flat surface.

A configuration of the internal side surface of the concave part 93 is not limited to the example illustrated in FIG. 13. An example illustrated in FIG. 14 can be applied.

The first adhesive 41 is provided in the area surrounded by plural electrode terminals 12 on the upper surface of the supporting board 11 suctioned and held on the bonding stage 91 so as to cover the second semiconductor element 31. The first adhesive 41 is made of the thermosetting material whose main ingredient is, for example, epoxy group resin. See FIG. 24(e).

Covering with the first adhesive 41 may be continuously performed on the bonding stage 91 after a resin sealing part 62 including the second semiconductor element 31 is formed.

On the other hand, the second main surface (rear surface, electronic circuit non-forming surface) of the first semiconductor element 21 is suctioned and held to the bonding tool 86 via the absorption hole 87. The bonding tool 86 is heated at a designated temperature (approximately 270° C. through approximately 300° C.).

The convex shaped outside connection terminals 24 are provided on the first outside connection terminal pads 22 of the first semiconductor element 21.

The insulation layer 25 is provided in an area surrounded by the first outside connection terminal pads 22 of the electronic circuit forming surface of the first semiconductor element 21. The insulation layer 25 having elasticity is made of a material whose main ingredient is, for example, polyimide group resin, silicon group resin, or epoxy group resin. The insulation layer 25 has thickness of, for example, approximately 1 µm through approximately 15 µm.

The outside connection terminals 24 of the first semiconductor element 21 and the first electrode terminals 12 of the supporting board 11 are made face each other so as to be positioned.

At this time, the first semiconductor element 21 is above the sealing resin 62 configured to cover the second semiconductor element 21. The main surface (electronic circuit forming surface) of the first semiconductor element 21 faces the sealing resin 62. While height positions are controlled, the bonding tool 86 is lowered as indicated by an arrow P in FIG. 24(f) until the outside connection terminals 24 of the first semiconductor element 21 comes in contact with the first electrode terminals 12 on the supporting board 11 (first pressing by a position control).

Because of this, a designated load is applied to the outside connection terminals 24 of the first semiconductor element 21 by the bonding tool 86, so that the outside connection terminals 24 of the first semiconductor element 21 are connected to the electrode terminals 12 of the supporting board 11. At this time, simultaneously, the first semiconductor element 21 presses the sealing resin 62 configured to cover the second semiconductor element 31 via the insulation layer 25 provided on the surface of the first semiconductor element 21.

Accordingly, the pressing force accompanied by the lowering of the bonding tool 86 is applied to the supporting board 11 via the first semiconductor element 21, the sealing resin 62 configured to cover the second semiconductor element 31, the second semiconductor element 31, and the first adhesive 41.

By this pressing force, at least a part of the supporting board 11 right under the second semiconductor element 31, right under the sealing resin 62 configured to cover the second semiconductor element 31, and its periphery are pressed into the concave part 93 of the bonding stage 91 so as to extend.

At this time, the bonding tool 86 configured to take suction on and hold the first semiconductor element 21 is heated at a designated temperature.

Heat from the bonding tool 86 is conducted to the supporting board 11 via the first semiconductor element 21, the second semiconductor element 31, and the sealing resin 62 configured to cover the second semiconductor element 31, and thereby the supporting board 11 is locally heated. By this heat, local thermal expansion is generated and progresses at the supporting board 11 so that the supporting board 11 is easily expanded in the concave part 93 of the bonding stage 91 and begins bending.

The viscosity of the first adhesive 41 adhered on the supporting board 11 is decreased due to heat from the bonding tool 86 conducted by contact of the supporting board 11 and the resin sealing part 62 including the second semiconductor element 31 so that flowability of the first adhesive 41 is increased. Accordingly, the first adhesive 41 is pushed and extended in the entire area of the first semiconductor element 21 between the supporting board 11 and the first semiconductor element 21, and thermosetting progresses.

Until the outside connection terminals 24 of the first semiconductor element 21 are connected to the electrode terminals 12 of the supporting board 11 and the flip chip mounting of the first semiconductor element 21 on the supporting board 11 is completed, a load detected by the load sensor connected to the bonding tool 86 is maintained. See FIG. 25(g) (Second pressing by the load control).

Since the insulation layer 25 provided on the electronic circuit forming surface of the first semiconductor element 21 has elasticity, it is possible to prevent the electronic circuit forming part of the first semiconductor element 21 from being damaged due to a load applied to the first semiconductor element 21 at the time of flip chip mounting. In other words, the insulation layer 25 functions as a stress relief layer configured to prevent damage of the main surface (electronic circuit forming surface) of the first semiconductor element 21 by reliving the stress acting in the first semiconductor element 21 due to force from the resin sealing part 62 including the second semiconductor element 31 when the first semiconductor element 21 is stacked on the resin sealing part 62 including the second semiconductor element 31 and flip chip mounted on the supporting board 11.

When the first semiconductor element 21 is mounted on the supporting board 11, while a configuration where the supporting board 11 is bent in the concave part 93 of the bonding stage 91 is maintained, the first adhesive 41 is cured. By the adhesive force and shrinkage force on curing of the first adhesive 41, connection between the first semiconductor element 21 and the supporting board 11 via the outside connection terminals 24 is maintained.

Next, suction by the bonding tool 86 is turned off and the bonding tool 75 starts rising as indicated by arrow Q in FIG. 25(h).

After that, plural outside connection terminals 13 such as spherical-shaped electrode terminals whose main ingredient is solder are provided on the conductive layer selectively provided on the rear surface of the supporting board 11. As a result of this, the semiconductor device 400 illustrated in FIG. 8 is formed.

Thus, in this manufacturing method, pressing to the supporting board 11 by the bonding tool 86 is performed on the bonding stage 91 having the concave part 93 and supporting the supporting board 11 is performed via the first semiconductor element 21 flip chip mounted on the supporting board 11, the second semiconductor element 31 flip chip mounted on the supporting board 11, and the sealing resin 62 covering the second semiconductor element 31. As a result of this, the supporting board 11 is locally pressed into the concave part 93.

In addition, the supporting board 11 is locally heated by heat conducted from the bonding tool 86 to the first semiconductor element 21, the second semiconductor element 31, and the sealing resin 62 covering the second semiconductor element 31. As a result of this, the supporting board 11 is expanded and bent in the concave part 93 of the bonding stage 91.

In other words, the concave part S where the second semiconductor element 31 can be received is formed in the supporting board 11 by local expansion or bending of the supporting board 11 generated by local pressing or heating. Therefore, since the second semiconductor element 31 and the sealing resin 62 covering the second semiconductor element 31 can be received in the thickness direction of the second semiconductor element 31 in the concave part S, while two semiconductor elements 21 and 31 and the sealing resin 62 are stacked on the supporting board 11, there is no substantial increase of thickness corresponding to the entire thicknesses of the second semiconductor element 31 and the sealing resin 62.

In the manufacturing method of this embodiment, it is possible to manufacture the semiconductor device having plural semiconductor elements, the first semiconductor element 21 and the second semiconductor element 31, and required to be thin and small-sized, with a simple process, so that the manufacturing cost can be reduced.

While the height position of the bonding tool 86 is controlled, the bonding tool 86 is lowered so that the outside connection terminals 24 of the first semiconductor element 21 come in contact with the electrode terminals 12 of the supporting board 11. After that, the load of the bonding tool 86 is controlled and thereby the load is applied to the outside connection terminals 24. By this pressing or application of the load, the outside connection terminals 24 are securely connected to the electrode terminals 12 of the supporting board 11 so that the mounting structure with high connection reliability can be obtained.

In this manufacturing method, the absorption hole 94 connected to the suction mechanism may be provided at the bottom part of the concave part 93 provided on the bonding stage 91. While the inside of the concave part 93 is discharged and decompressed, the first semiconductor element 21 can be flip chip mounted on the supporting board 11.

Thus, according to the embodiments discussed above, it is possible to provide the semiconductor device having plural semiconductor elements or plural functional elements such as the semiconductor element and the passive elements and being thin and small-sized. It is also possible to provide the manufacturing method whereby the above-mentioned semiconductor device can be manufactured with a low manufacturing cost.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority or inferiority of the invention. Although the embodiments of the present invention have been described in detail, it should be understood that the various changes, substitutions, and alterations could be made hereto without departing from the spirit and scope of the invention.

What is claimed is:

1. A manufacturing method of a semiconductor device, comprising:
   pressing an electronic component to a main surface of a supporting board via a first semiconductor element to bend the supporting board in a direction separating from the first semiconductor element and to form a first concave part at the supporting board, a part of the electronic component being located in the first concave part,
   wherein the supporting board includes a back surface which is on a back side of the main surface,
   the back surface includes a first part located below the electronic component and a second part which is other than the first part, and
   wherein pressing the electronic component includes making the first part be positioned lower than the second part.

2. The manufacturing method of a semiconductor device as claimed in claim 1,
   wherein the supporting board is heated when the electronic component is pressed to the supporting board.

3. The manufacturing method of a semiconductor device as claimed in claim 1, further comprising:
   mounting the first semiconductor element on the main surface of the supporting board.

4. The manufacturing method of a semiconductor device as claimed in claim 1,
   wherein the electronic component is a second semiconductor element provided independently from the first semiconductor element.

5. The manufacturing method of a semiconductor device as claimed in claim 1,
   wherein pressing the electronic component includes mounting the supporting board on a stage which includes a second concave part, and
   heating the supporting board to bend a part of the supporting board in the second concave part.

6. The manufacturing method of a semiconductor device as claimed in claim 1,
   wherein a cross section of an edge part defining an external circumferential part of the first concave part of the supporting board is expanding upward.

7. The manufacturing method of a semiconductor device as claimed in claim 1,
   wherein pressing the electronic component includes
   mounting the supporting board on a stage which includes a second concave part.

8. The manufacturing method of a semiconductor device as claimed in claim 1,
   wherein the first semiconductor element is heated by a jig, the jig being configured to attract and hold the first semiconductor element; and
   heat of the first semiconductor element is conducted to the supporting board via an outside connection terminal and the electronic component, the outside connection terminal being provided on the first semiconductor element and configured to couple the supporting board and the first semiconductor element to each other.

9. The manufacturing method of a semiconductor device as claimed in claim 1,
   wherein the supporting board is locally heated at a temperature equal to or greater than a glass transition temperature of the supporting board.

10. A manufacturing method of a semiconductor device, comprising:
    providing a second semiconductor element between a supporting board and a first semiconductor element, the supporting board including an upper surface and a lower surface, the lower surface including a first part and a second part which is other than the first part;
    pressing the second semiconductor element to the upper surface of the supporting board via the first semiconductor element with the supporting board heated to bend the supporting board and to make the first part which is located below the second semiconductor element be positioned lower than the second part; and fixing the first semiconductor element to the supporting board with the supporting board bent.

11. The manufacturing method of a semiconductor device as claimed in claim 10, wherein pressing the second semiconductor element includes mounting the supporting board on a stage which includes a concave part.

* * * * *